(12) United States Patent
Sharangpani et al.

(10) Patent No.: US 9,659,955 B1
(45) Date of Patent: May 23, 2017

(54) CRYSTALINITY-DEPENDENT ALUMINUM OXIDE ETCHING FOR SELF-ALIGNED BLOCKING DIELECTRIC IN A MEMORY STRUCTURE

(71) Applicant: SANDISK TECHNOLOGIES INC., Plano, TX (US)

(72) Inventors: Rahul Sharangpani, Fremont, CA (US); Sateesh Koka, Milpitas, CA (US); Raghuveer S. Makala, Campbell, CA (US); Somesh Peri, San Jose, CA (US); Senaka Kanakamedala, San Jose, CA (US)

(73) Assignee: SANDISK TECHNOLOGIES LLC, Plano, TX (US)

( * ) Notice: Subject to any disclaimer, the term of this patent is extended or adjusted under 35 U.S.C. 154(b) by 0 days.

(21) Appl. No.: 14/925,171

(22) Filed: Oct. 28, 2015

(51) Int. Cl.
   *H01L 21/02* (2006.01)
   *H01L 27/11582* (2017.01)
   *H01L 21/311* (2006.01)

(52) U.S. Cl.
   CPC .. *H01L 27/11582* (2013.01); *H01L 21/02178* (2013.01); *H01L 21/02356* (2013.01); *H01L 21/31111* (2013.01)

(58) Field of Classification Search
   CPC ......... H01L 27/11524; H01L 27/11556; H01L 21/823807; H01L 21/823431;
   (Continued)

(56) References Cited

U.S. PATENT DOCUMENTS 5,084,417 A   1/1992 Joshi et al.
5,807,788 A   9/1998 Brodsky et al.
(Continued)

FOREIGN PATENT DOCUMENTS

WO   WO02/15277 A2    2/2002
WO   WO2012/003301 A2  1/2012

OTHER PUBLICATIONS

Jang et al., "Vertical Cell Array Using TCAT (Terabit Cell Array Transistor) Technology for Ultra High Density NAND Flash Memory," 2009 Symposium on VLSI Technology Digest of Technical Papers, pp. 192-193.
(Continued)

*Primary Examiner* — Chuong A Luu
*Assistant Examiner* — Rodolfo D Fortich
(74) *Attorney, Agent, or Firm* — The Marbury Law Group PLLC

(57) ABSTRACT

A method of forming a device includes forming an alternating stack of insulating layers and sacrificial material layers over a substrate, forming a memory opening extending through the alternating stack, and forming an aluminum oxide layer on sidewall surfaces of the sacrificial material layers and on sidewall surfaces of the insulating layers around the memory opening. First aluminum oxide portions of the aluminum oxide layer are located on sidewall surfaces of the sacrificial material layers, and second aluminum oxide portions of the aluminum oxide layer are located on sidewalls of the insulating layers. The method also includes removing the second aluminum oxide portions at a greater etch rate than the first aluminum oxide portions employing a selective etch process, such that all or a predominant portion of each first aluminum oxide portion remains after removal of the second aluminum oxide portions.

19 Claims, 21 Drawing Sheets

(58) Field of Classification Search
CPC ........... H01L 21/823814; H01L 21/324; H01L 21/823821; H01L 21/845; H01L 21/26506; H01L 21/84; H01L 21/02164; H01L 21/0228; H01L 21/31111; H01L 21/76224
USPC .......................... 438/142, 157, 270, 190, 324
See application file for complete search history.

(56) References Cited

U.S. PATENT DOCUMENTS

| | | | |
|---|---|---|---|
| 5,915,167 | A | 6/1999 | Leedy |
| 7,177,191 | B2 | 2/2007 | Fasoli et al. |
| 7,221,588 | B2 | 5/2007 | Fasoli et al. |
| 7,233,522 | B2 | 6/2007 | Chen et al. |
| 7,514,321 | B2 | 4/2009 | Mokhlesi et al. |
| 7,575,973 | B2 | 8/2009 | Mokhlesi et al. |
| 7,745,265 | B2 | 6/2010 | Mokhlesi et al. |
| 7,745,312 | B2 | 6/2010 | Herner et al. |
| 7,799,670 | B2 | 9/2010 | Ramkumar et al. |
| 7,808,038 | B2 | 10/2010 | Mokhlesi et al. |
| 7,848,145 | B2 | 12/2010 | Mokhlesi et al. |
| 7,851,851 | B2 | 12/2010 | Mokhlesi et al. |
| 8,008,710 | B2 | 8/2011 | Fukuzumi et al. |
| 8,053,829 | B2 | 11/2011 | Kang et al. |
| 8,187,936 | B2 | 5/2012 | Alsmeier et al. |
| 8,193,054 | B2 | 6/2012 | Alsmeier |
| 8,198,672 | B2 | 6/2012 | Alsmeier |
| 8,283,228 | B2 | 10/2012 | Alsmeier |
| 8,309,405 | B2 | 11/2012 | Yang et al. |
| 8,349,681 | B2 | 1/2013 | Alsmeier et al. |
| 8,569,827 | B2 | 10/2013 | Lee et al. |
| 8,614,126 | B1 | 12/2013 | Lee et al. |
| 8,658,499 | B2 | 2/2014 | Makala et al. |
| 8,946,023 | B2 | 2/2015 | Makala et al. |
| 9,023,719 | B2 | 5/2015 | Pachamuthu et al. |
| 2007/0210338 | A1 | 9/2007 | Orlowski |
| 2007/0252201 | A1 | 11/2007 | Kito et al. |
| 2009/0242967 | A1* | 10/2009 | Katsumata ............ H01L 21/764 257/324 |
| 2009/0283819 | A1 | 11/2009 | Ishikawa et al. |
| 2010/0044778 | A1 | 2/2010 | Seol |
| 2010/0112769 | A1 | 5/2010 | Son et al. |
| 2010/0120214 | A1 | 5/2010 | Park et al. |
| 2010/0155810 | A1 | 6/2010 | Kim et al. |
| 2010/0155818 | A1 | 6/2010 | Cho |
| 2010/0181610 | A1 | 7/2010 | Kim et al. |
| 2010/0207195 | A1 | 8/2010 | Fukuzumi et al. |
| 2010/0320528 | A1 | 12/2010 | Jeong et al. |
| 2011/0076819 | A1 | 3/2011 | Kim et al. |
| 2011/0133606 | A1 | 6/2011 | Yoshida et al. |
| 2011/0266606 | A1 | 11/2011 | Park et al. |
| 2011/0291178 | A1 | 12/2011 | Sasaki et al. |
| 2012/0001247 | A1 | 1/2012 | Alsmeier |
| 2012/0001249 | A1 | 1/2012 | Alsmeier |
| 2012/0012920 | A1* | 1/2012 | Shin .................. H01L 27/11578 257/324 |
| 2012/0146127 | A1 | 6/2012 | Lee et al. |
| 2012/0156848 | A1 | 6/2012 | Yang et al. |
| 2012/0256247 | A1 | 10/2012 | Alsmeier |
| 2013/0134492 | A1 | 5/2013 | Yang et al. |
| 2013/0248974 | A1 | 9/2013 | Alsmeier et al. |
| 2013/0264631 | A1 | 10/2013 | Alsmeier et al. |
| 2013/0313627 | A1 | 11/2013 | Lee et al. |
| 2014/0008714 | A1 | 1/2014 | Makala et al. |
| 2014/0151774 | A1 | 6/2014 | Rhie |
| 2014/0225181 | A1 | 8/2014 | Makala et al. |
| 2014/0295636 | A1 | 10/2014 | Makala et al. |
| 2015/0008505 | A1 | 1/2015 | Chien et al. |
| 2015/0076580 | A1 | 3/2015 | Pachamuthu et al. |
| 2015/0076584 | A1 | 3/2015 | Pachamuthu et al. |
| 2015/0179660 | A1 | 6/2015 | Yada et al. |

OTHER PUBLICATIONS

Katsumata et al., "Pipe-Shaped BiCS Flash Memory with 16 Stacked Layers and Multi-Level-Cell Operation for Ultra High Density Storage Devices," 2009 Symposium on VLSI Technology Digest of Technical Papers, pp. 136-137.
Maeda et al., "Multi-Stacked 1G Cell/Layer Pipe-Shaped BiCS Flash Memory," 2009 Symposium on VLSI Technology Digest of Technical Papers, pp. 22-23.
Endoh et al., "Novel Ultra High Density Memory with a Stacked-Surrounding Gate Transistor (S-SGT) Structured Cell," IEDM Proc. (2001) 33-36.
Tanaka et al., "Bit-Cost Scalable Technology for Low-Cost and Ultrahigh-Density Flash Memory," Toshiba Review, vol. 63, No. 2, 2008, pp. 28-31.
Masahide Kimura, "3D Cells Make Terabit NAND Flash Possible," Nikkei Electronics Asia, Sep. 17, 2009, 6pgs.
International Search Report & Written Opinion, PCT/US2011/042566, Jan. 17, 2012.
Invitation to Pay Additional Fees & Partial International Search Report, PCT/US2011/042566, Sep. 28, 2011.
Jang et al., "Memory Properties of Nickel Suicide Nanocrystal Layer for Possible Application to Nonvolatile Memory Devices," IEEE Transactions on Electron Devices, vol. 56, No. 12, Dec. 2009.
Chen et al., "Reliability Characteristics of NiSi Nanocrystals Embedded in Oxide and Nitride Layers for Nonvolatile Memory Application," Applied Physics Letters 92, 152114 (2008).
J. Ooshita, Toshiba Announces 32Gb 3D-Stacked Multi-Level NAND Flash, 3 pages, http://techon.nikkeibp.co.jp/english/NEWS_EN/20090619/171977/ Nikkei Microdevices, Tech-On, Jun. 19, 2009.
Li et al., "Sacrificial Polymers for Nanofluidic Channels in Biological Applications", Nanotechnology 14 (2003) 578-583.
Invitation to Pay Additional Fees, including Annex to Form PCT/ISA/206 Communication Relating to The Results of the Partial International Search for PCT/US2014/048160, issued on Oct. 31, 2014.
Invitation to Pay Additional Fees, including Annex to Form PCT/ISA/206 Communication Relating to The Results of the Partial International Search for PCT/US2014/032123, dated Jul. 15, 2014.
Kim, S. K. et al., "Low Temperature (<100C) Deposition of Aluminum Oxide Thin Films by ALD With $O_3$ as Oxidant," Journal of The Electrochemical Society, vol. 153, No. 5, pp. F69-F76, (2006).
Pong, R. et al., "A Displacement Reaction Source Demonstrated for Aluminum Implantation and Proposed for Indium Implantation," IEEE Ion Implantation Technology Proceedings, 1998 International Conference, vol. 1, pp. 388-391, (1998).
Grampeix, H. et al., "Effect of Nitridation for High-K Layers by ALCVD™ in Order to Decrease the Trapping in Non Volatile Memories," ECS Transactions, vol. 11, No. 7, pp. 213-225, (2007).
Frank, M. M. et al., "Enhanced Initial Growth of Atomic-Layer-Deposited Metal Oxides on Hydrogen-Terminated Silicon," Applied Physics Letters, vol. 83, No. 4, pp. 740-739, (2003).
Wang et al., "Low Temperature Silicon Selective Epitaxial Growth (SEG) and Phosphorous Doping in a Reduced-Pressure Pancake Reactor", ECE Technical Reports, Paper 299 (Apr. 1, 1992).
Whang et al., "Novel 3-Dimensional Dual Control-Gate with Surrounding Floating-Gate (DC-SF) NAND Flash Cell for 1Tb File Storage Application", IEDM-2010 Proceedings, Dec. 6-8, 2010, pp. 668-671.
Trowbridge et al., "Enhanced Oxidation of Silicon Nitride Using In Situ Steam Generation," 199th ECS Conf. vol. 2000. 2001.
Lamagna, L et al., "Mechanisms for Substrate-Enhanced Growth during the Early Stages of Atomic Layer Deposition of Alumina onto Silicon Nitride Surfaces," *Chem. Mater.*, vol. 24, No. 6, pp. 1080-1090, (2012).
U.S. Appl. No. 14/133,979, filed Dec. 19, 2013, SanDisk Technologies Inc.
U.S. Appl. No. 14/519,733, filed Oct. 21, 2014, SanDisk Technologies Inc.
U.S. Appl. No. 14/523,287, filed Oct. 24, 2014, SanDisk Technologies Inc.

(56) References Cited

OTHER PUBLICATIONS

U.S. Appl. No. 14/530,220, filed Oct. 31, 2014, SanDisk Technologies Inc.
U.S. Appl. No. 14/539,307, filed Nov. 12, 2014, SanDisk Technologies Inc.
U.S. Appl. No. 14/539,372, filed Nov. 12, 2014, SanDisk Technologies Inc.
U.S. Appl. No. 14/600,226, filed Jan. 20, 2015, SanDisk Technologies, Inc.
U.S. Appl. No. 14/620,674, filed Feb. 12, 2015, SanDisk Technologies, Inc.
U.S. Appl. No. 14/748,871, filed Jun. 24, 2015, SanDisk Technologies, Inc.

* cited by examiner

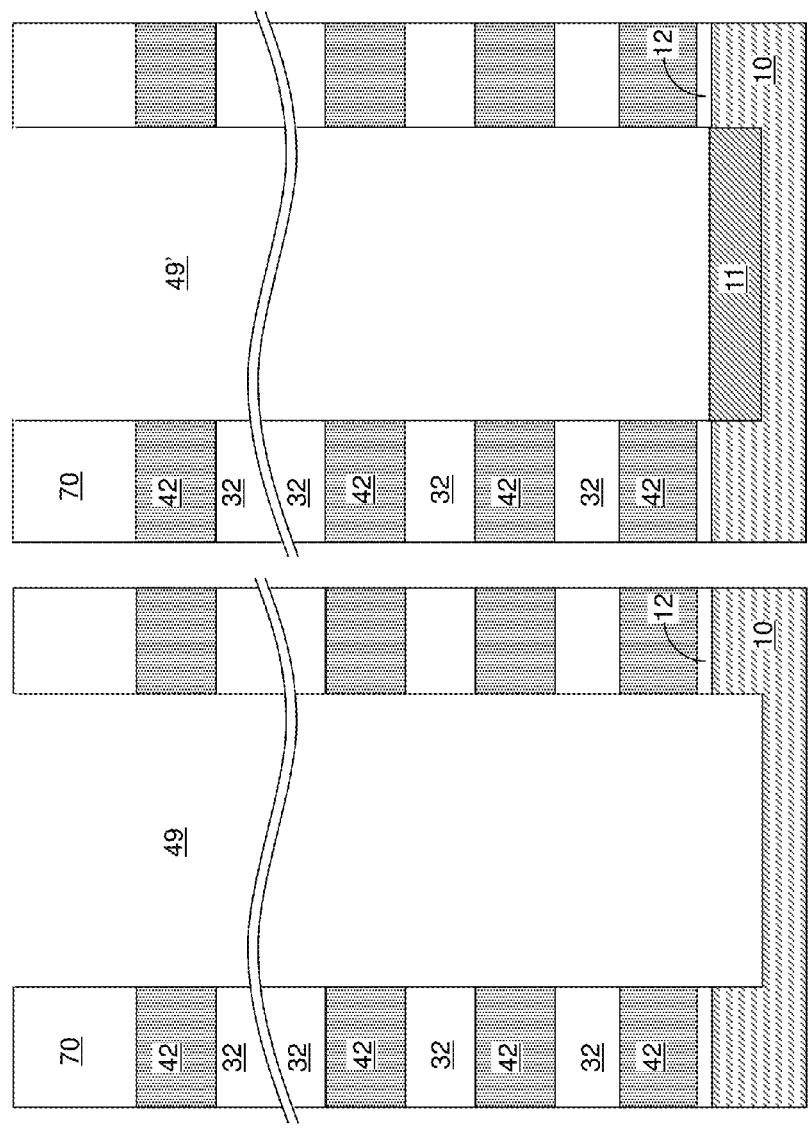

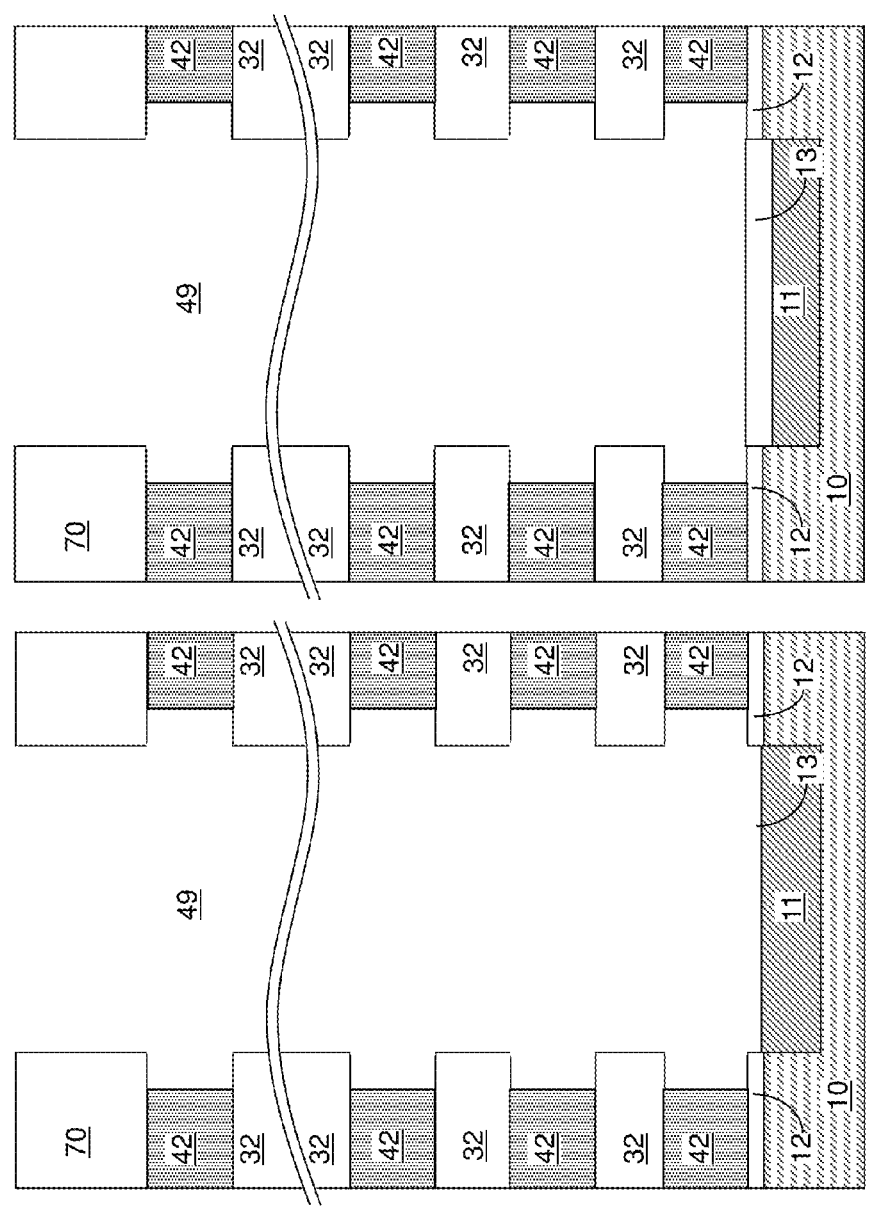

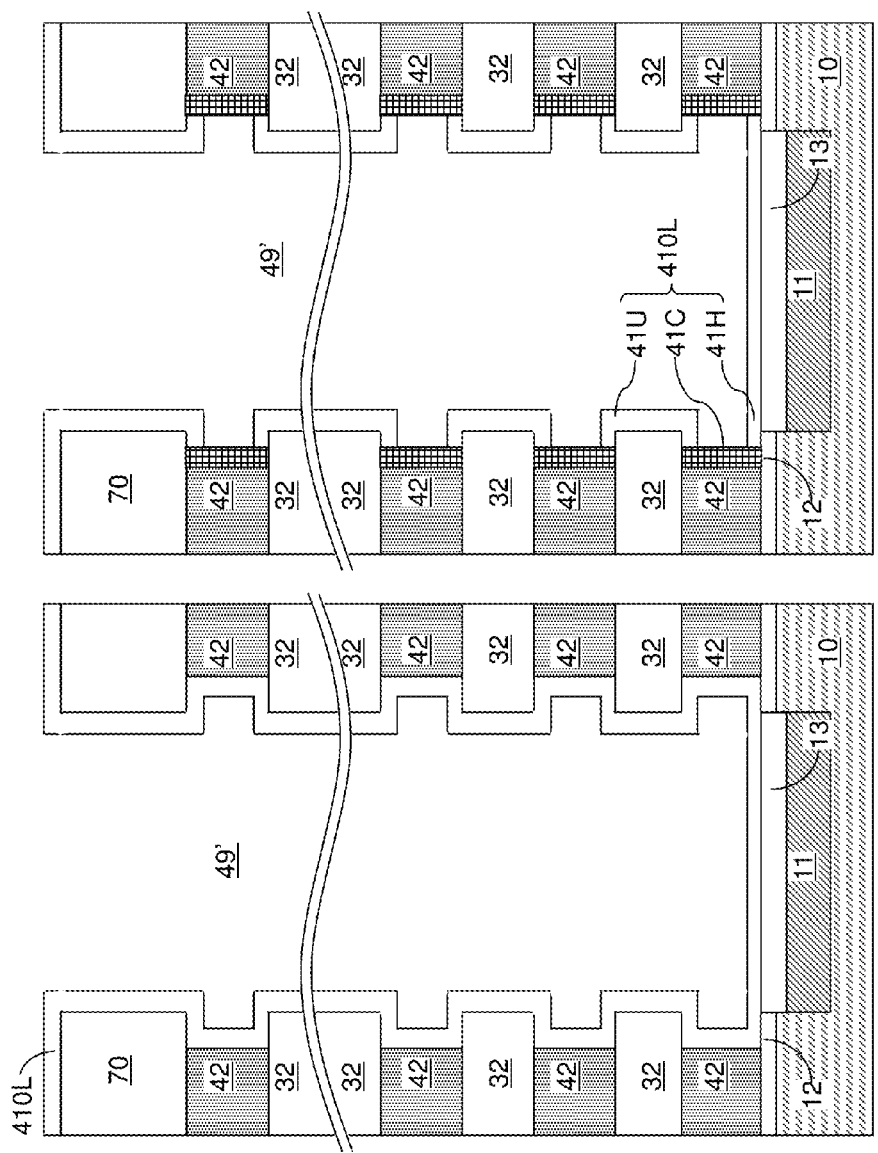

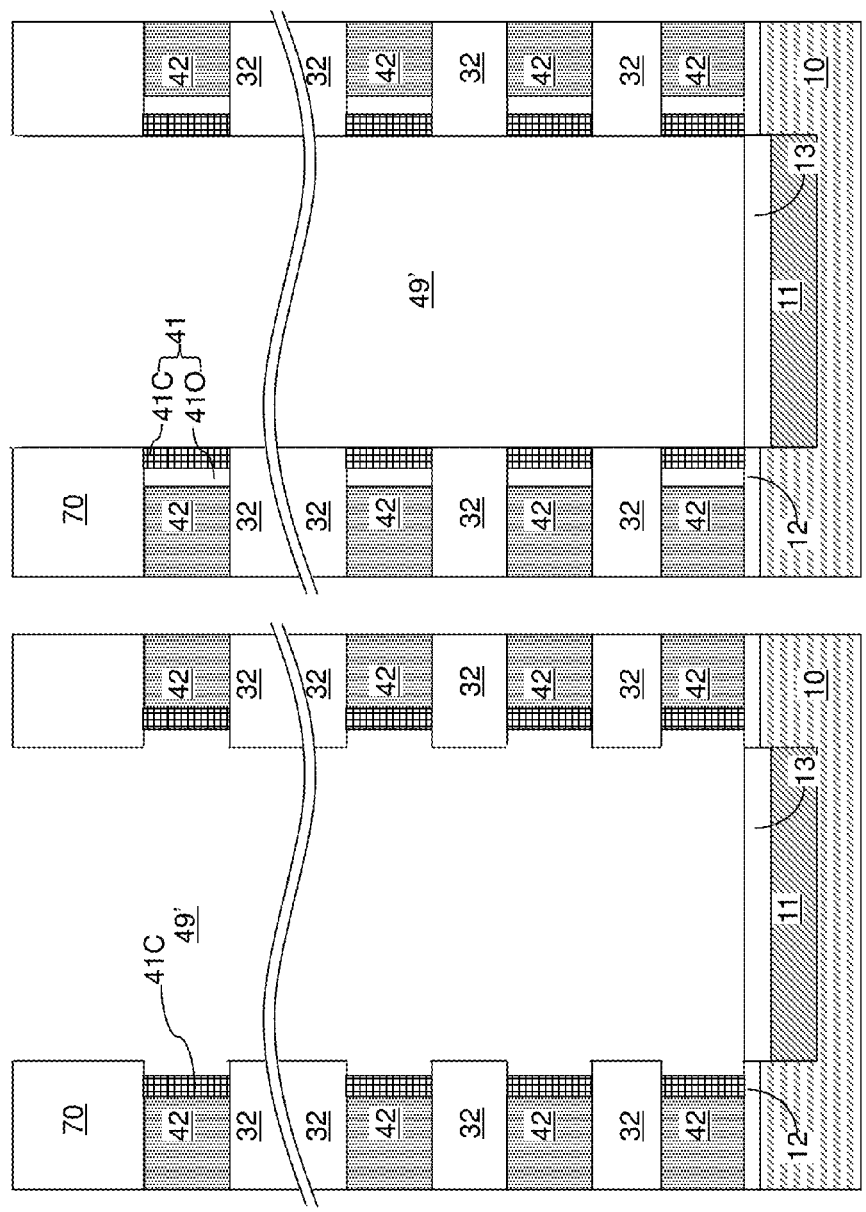

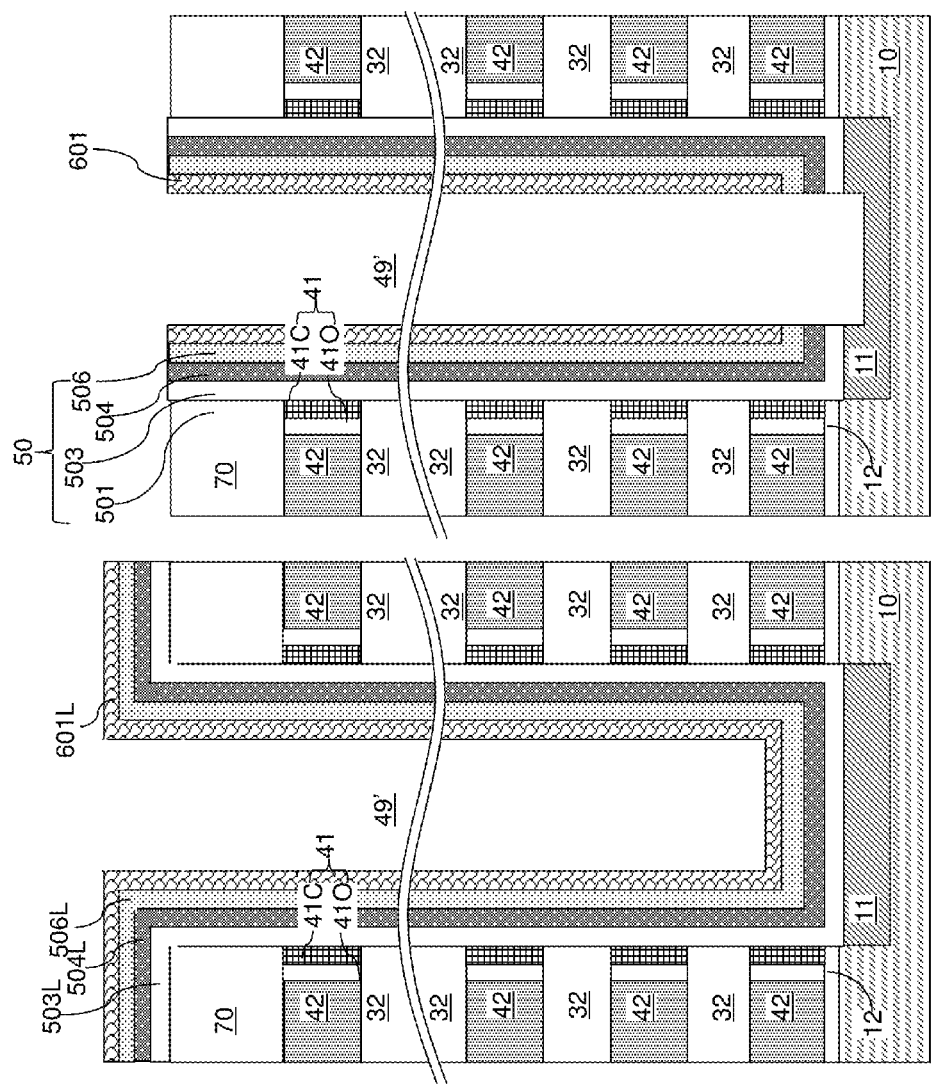

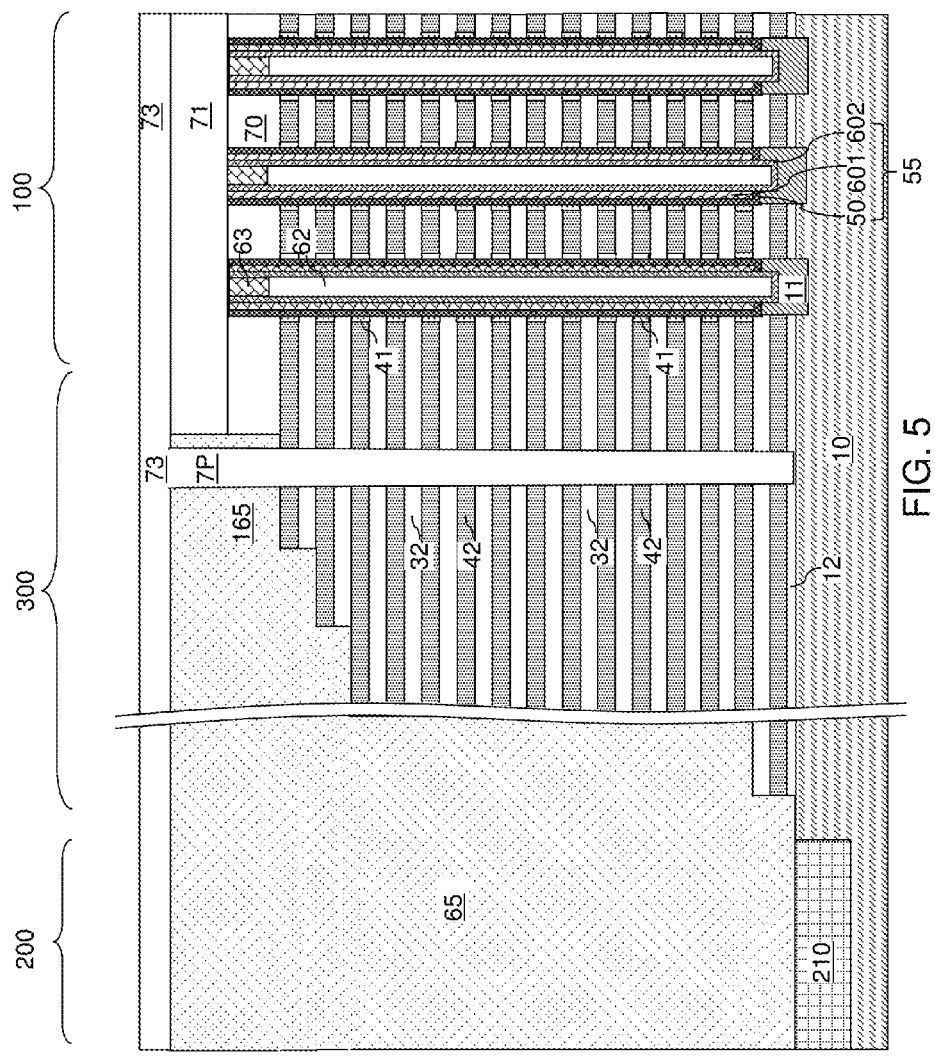

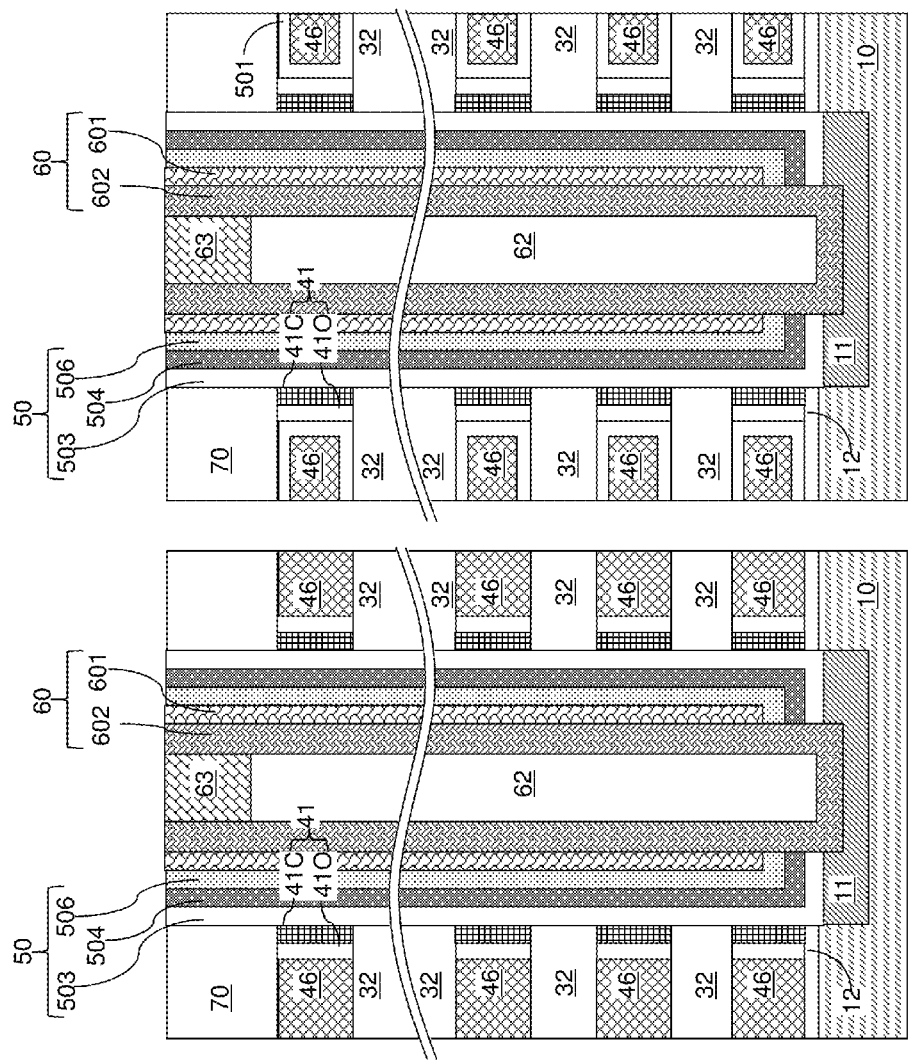

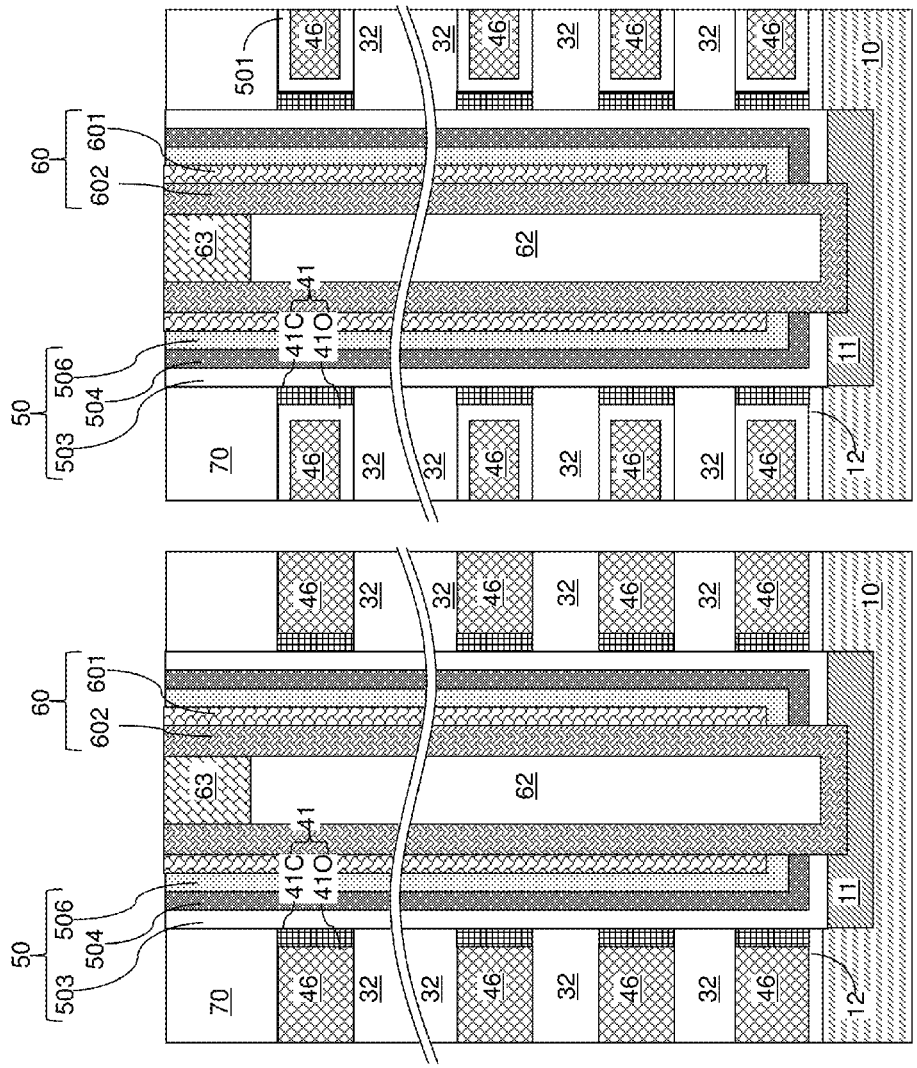

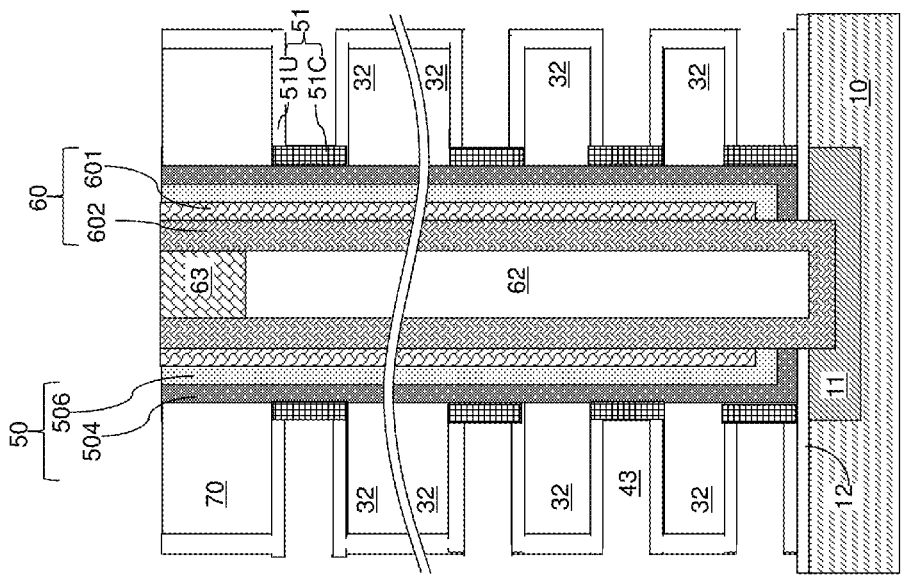
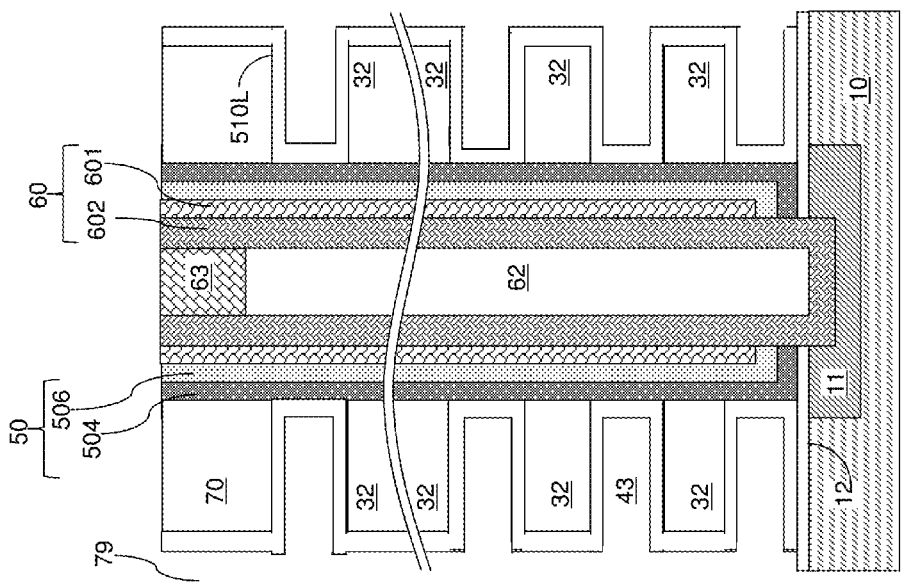

CRYSTALINITY-DEPENDENT ALUMINUM OXIDE ETCHING FOR SELF-ALIGNED BLOCKING DIELECTRIC IN A MEMORY STRUCTURE

FIELD

The present disclosure relates generally to the field of semiconductor devices and specifically to three-dimensional memory devices, such as vertical NAND strings and other three-dimensional devices, and methods of making thereof.

BACKGROUND

Three-dimensional vertical NAND strings having one bit per cell are disclosed in an article by T. Endoh, et. al., titled "Novel Ultra High Density Memory With A Stacked-Surrounding Gate Transistor (S-SGT) Structured Cell", IEDM Proc. (2001) 33-36.

SUMMARY

According to an aspect of the present disclosure, a method of forming a device includes forming an alternating stack of insulating layers and sacrificial material layers over a substrate, forming a memory opening extending through the alternating stack, and forming an aluminum oxide layer on sidewall surfaces of the sacrificial material layers and on sidewall surfaces of the insulating layers around the memory opening. First aluminum oxide portions of the aluminum oxide layer are located on sidewall surfaces of the sacrificial material layers, and second aluminum oxide portions of the aluminum oxide layer are located on sidewalls of the insulating layers. The method also includes removing the second aluminum oxide portions at a greater etch rate than the first aluminum oxide portions employing a selective etch process, such that all or a predominant portion of each first aluminum oxide portion remains after removal of the second aluminum oxide portions.

According to another aspect of the present disclosure, a three-dimensional memory device is provided, which includes an alternating stack of insulating layers and electrically conductive layers located over a substrate, and a memory stack structure extending through the alternating stack. The memory stack structure includes, from inside to outside, a semiconductor channel, a tunneling dielectric, and charge storage regions. The three-dimensional memory device further includes a plurality of crystalline aluminum oxide portions located at levels of the electrically conductive layers and laterally surrounding the memory stack structure, and a plurality of silicon oxide-containing portions contacting an outer sidewall of a respective crystalline aluminum oxide portion. Each of the silicon oxide-containing portions includes a silicon oxynitride portion having a radial nitrogen concentration gradient around the memory opening.

According to another aspect of the present disclosure, a method of selectively wet etching an aluminum oxide layer, comprises depositing an amorphous aluminum oxide layer having a thickness of 3 nm or less on first and second surfaces such that a first portion of the amorphous aluminum oxide layer contacts the first surface and a second portion of the amorphous aluminum oxide layer contacts the second surface which comprises a different material than the first surface, performing a selective crystallization anneal process on the amorphous aluminum oxide layer, wherein the first portion of the amorphous aluminum oxide layer is crystallized into a crystalline aluminum oxide portion while the second portion of the amorphous aluminum oxide layer remains as an amorphous aluminum oxide portion, and selectively wet etching the amorphous aluminum oxide portion such that all or a predominant portion the crystalline aluminum oxide portion remains after the step of selectively wet etching.

BRIEF DESCRIPTION OF THE DRAWINGS

FIGS. 2A-2F and 2J-2Q are sequential vertical cross-sectional views of a memory opening within the exemplary structure during various processing steps employed to form a memory stack structure according to an embodiment of the present disclosure.

FIG. 5 is a vertical cross-sectional view of the exemplary structure after formation of dielectric pillar structures according to an embodiment of the present disclosure.

FIGS. 9A-9D are vertical cross-sectional views of exemplary memory stack structures after formation of electrically conductive layers according to various embodiment of the present disclosure.

FIGS. 11A and 11B are sequential vertical cross-sectional views of an exemplary structure during various processing steps employed to form a backside blocking dielectric according to an alternative embodiment of the present disclosure.

DETAILED DESCRIPTION

Figure 1:
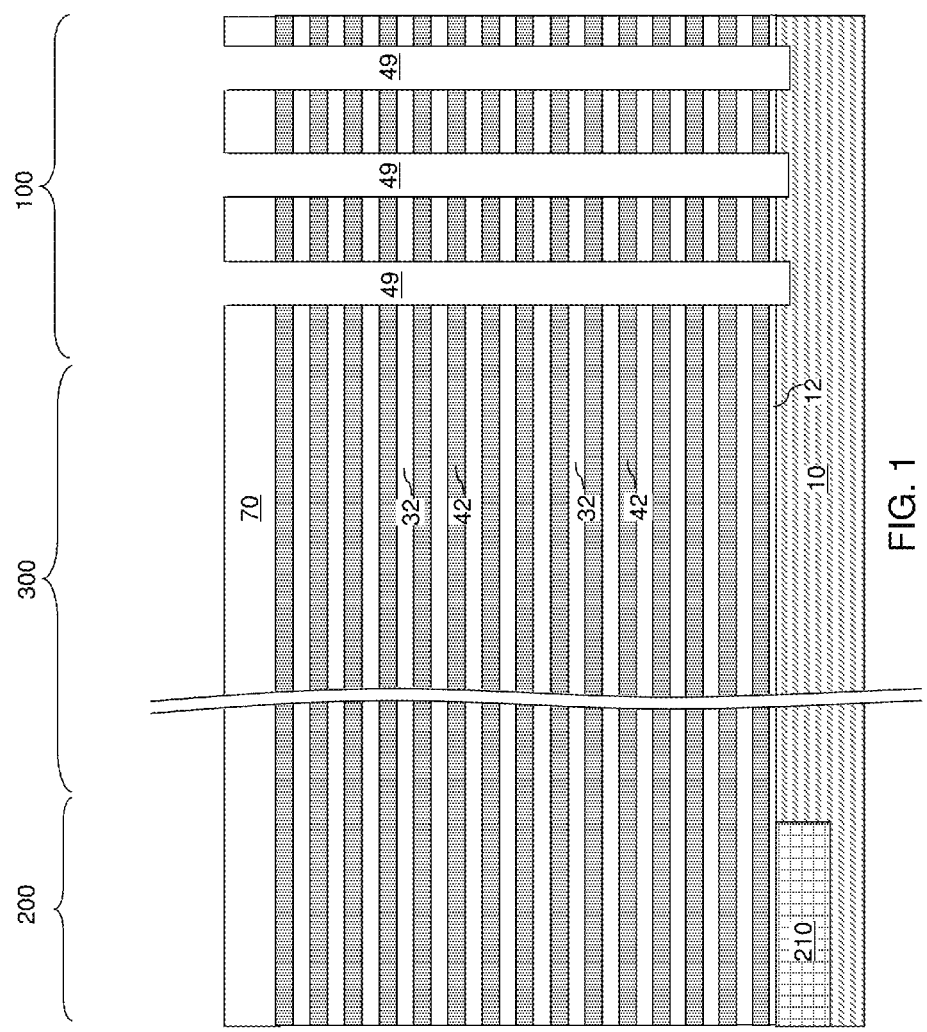
FIG. 1 is a vertical cross-sectional view of an exemplary structure after formation of an alternating stack of insulating layers and sacrificial material layers and memory openings extending through the alternating stack according to an embodiment of the present disclosure.

As discussed above, the present disclosure is directed to three-dimensional memory devices, such as vertical NAND strings and other three-dimensional devices, and methods of making thereof, the various aspects of which are described below. The embodiments of the disclosure can be employed to form various structures including a multilevel memory structure, non-limiting examples of which include semiconductor devices such as three-dimensional monolithic memory array devices comprising a plurality of NAND memory strings. The drawings are not drawn to scale. Multiple instances of an element may be duplicated where a single instance of the element is illustrated, unless absence of duplication of elements is expressly described or clearly indicated otherwise. Ordinals such as "first," "second," and "third" are employed merely to identify similar elements, and different ordinals may be employed across the specification and the claims of the instant disclosure. As used herein, a first element located "on" a second element can be located on the exterior side of a surface of the second element or on the interior side of the second element. As used herein, a first element is located "directly on" a second element if there exist a physical contact between a surface of the first element and a surface of the second element.

As used herein, a "layer" refers to a material portion including a region having a substantially uniform thickness. A layer may extend over the entirety of an underlying or overlying structure, or may have an extent less than the extent of an underlying or overlying structure. Further, a layer may be a region of a homogeneous or inhomogeneous continuous structure that has a thickness less than the thickness of the continuous structure. For example, a layer may be located between any pair of horizontal planes between, or at, a top surface and a bottom surface of the continuous structure. A layer may extend horizontally, vertically, and/or along a tapered surface. A substrate may be a layer, may include one or more layers therein, and/or may have one or more layer thereupon, thereabove, and/or therebelow.

As used herein, a "field effect transistor" refers to any semiconductor device having a semiconductor channel through which electrical current flows with a current density modulated by an external electrical field. As used herein, an "active region" refers to a source region of a field effect transistor or a drain region of a field effect transistor. A "top active region" refers to an active region of a field effect transistor that is located above another active region of the field effect transistor. A "bottom active region" refers to an active region of a field effect transistor that is located below another active region of the field effect transistor. A monolithic three-dimensional memory array is a memory array in which multiple memory levels are formed above a single substrate, such as a semiconductor wafer, with no intervening substrates. The term "monolithic" means that layers of each level of the array are directly deposited on the layers of each underlying level of the array. In contrast, two dimensional arrays may be formed separately and then packaged together to form a non-monolithic memory device. For example, non-monolithic stacked memories have been constructed by forming memory levels on separate substrates and vertically stacking the memory levels, as described in U.S. Pat. No. 5,915,167 titled "Three-dimensional Structure Memory." The substrates may be thinned or removed from the memory levels before bonding, but as the memory levels are initially formed over separate substrates, such memories are not true monolithic three-dimensional memory arrays. The various three-dimensional memory devices of the present disclosure include a monolithic three-dimensional NAND string memory device, and can be fabricated employing the various embodiments described herein.

Referring to FIG. 1, an exemplary structure according to an embodiment of the present disclosure is illustrated, which can be employed, for example, to fabricate a device structure containing vertical NAND memory devices. The exemplary structure includes a substrate, which can be a semiconductor substrate (e.g., a semiconductor substrate, such as a single crystalline silicon wafer). The substrate can include a semiconductor substrate layer 10. The semiconductor substrate layer 10 is a semiconductor material layer, and can include at least one elemental semiconductor material (e.g., silicon, such as single crystalline silicon), at least one III-V compound semiconductor material, at least one II-VI compound semiconductor material, at least one organic semiconductor material, or other semiconductor materials known in the art.

As used herein, a "semiconductor material" refers to a material having electrical conductivity in the range from $1.0 \times 10^{-6}$ S/cm to $1.0 \times 10^5$ S/cm, and is capable of producing a doped material having electrical conductivity in a range from 1.0 S/cm to $1.0 \times 10^5$ S/cm upon suitable doping with an electrical dopant. As used herein, an "electrical dopant" refers to a p-type dopant that adds a hole to a valence band within a band structure, or an n-type dopant that adds an electron to a conduction band within a band structure. As used herein, a "conductive material" refers to a material having electrical conductivity greater than $1.0 \times 10^5$ S/cm. As used herein, an "insulating material" or a "dielectric material" refers to a material having electrical conductivity less than $1.0 \times 10^{-6}$ S/cm. All measurements for electrical conductivities are made at the standard condition. The semiconductor substrate layer 10 can include at least one doped well (not expressly shown) having a substantially uniform dopant concentration therein.

The exemplary structure can have multiple regions for building different types of devices. Such areas can include, for example, a device region 100, a contact region 300, and a peripheral device region 200. In one embodiment, the semiconductor substrate layer 10 can include at least one a doped well in the device region 100. As used herein, a "doped well" refers to a portion of a semiconductor material having a doping of a same conductivity type (which can be p-type or n-type) and a substantially same level of dopant concentration throughout. The doped well can be the same as the semiconductor substrate layer 10 or can be a portion of the semiconductor substrate layer 10. The conductivity type of the doped well is herein referred to as a first conductivity type, which can be p-type or n-type. The dopant concentration level of the doped well is herein referred to as a first dopant concentration level. In one embodiment, the first dopant concentration level can be in a range from $1.0 \times 10^{15}/cm^3$ to $1.0 \times 10^{18}/cm^3$, although lesser and greater dopant concentration levels can also be employed. As used herein, a dopant concentration level refers to average dopant concentration for a given region.

Peripheral devices 210 can be formed in, or on, a portion of the semiconductor substrate layer 10 located within the peripheral device region 200. The peripheral devices can include various devices employed to operate the memory devices to be formed in the device region 100, and can include, for example, driver circuits for the various components of the memory devices. The peripheral devices 210 can include, for example, field effect transistors and/or passive components such as resistors, capacitors, inductors, diodes, etc.

Optionally, a gate dielectric layer 12 can be formed above the semiconductor substrate layer 10. The gate dielectric layer 12 can be employed as the gate dielectric for a first source select gate electrode. The gate dielectric layer 12 can include, for example, silicon oxide and/or a dielectric metal oxide (such as $HfO_2$, $ZrO_2$, $LaO_2$, etc.). The thickness of the gate dielectric layer 12 can be in a range from 3 nm to 30 nm, although lesser and greater thicknesses can also be employed.

An alternating stack of first material layers (which can be insulating layers 32) and second material layers (which are referred to spacer material layers) is formed over the top surface of the substrate, which can be, for example, on the top surface of the gate dielectric layer 12. As used herein, a "material layer" refers to a layer including a material throughout the entirety thereof. As used herein, a "spacer material layer" refers to a material layer that is located between two other material layers, i.e., between an overlying material layer and an underlying material layer. The spacer material layers can be formed as electrically conductive layers, or can be replaced with electrically conductive layers in a subsequent processing step.

As used herein, an alternating stack of first elements and second elements refers to a structure in which instances of the first elements and instances of the second elements alternate. Each instance of the first elements that is not an end element of the alternating plurality is adjoined by two instances of the second elements on both sides, and each instance of the second elements that is not an end element of the alternating plurality is adjoined by two instances of the first elements on both ends. The first elements may have the same thickness thereamongst, or may have different thicknesses. The second elements may have the same thickness thereamongst, or may have different thicknesses. The alternating plurality of first material layers and second material layers may begin with an instance of the first material layers or with an instance of the second material layers, and may end with an instance of the first material layers or with an instance of the second material layers. In one embodiment, an instance of the first elements and an instance of the second elements may form a unit that is repeated with periodicity within the alternating plurality.

Each first material layer includes a first material, and each second material layer includes a second material that is different from the first material. In one embodiment, each first material layer can be an insulating layer 32, and each second material layer can be a sacrificial material layer 42. In this case, the stack can include an alternating plurality of insulating layers 32 and sacrificial material layers 42, and constitutes a prototype stack of alternating layers comprising insulating layers 32 and sacrificial material layers 42. As used herein, a "prototype" structure or an "in-process" structure refers to a transient structure that is subsequently modified in the shape or composition of at least one component therein.

The stack of the alternating plurality is herein referred to as an alternating stack (32, 42). In one embodiment, the alternating stack (32, 42) can include insulating layers 32 composed of the first material, and sacrificial material layers 42 composed of a second material different from that of insulating layers 32. The first material of the insulating layers 32 can be at least one insulating material. As such, each insulating layer 32 can be an insulating material layer. Insulating materials that can be employed for the insulating layers 32 include, but are not limited to, silicon oxide (including doped or undoped silicate glass), silicon oxynitride in which oxygen atoms are the predominant non-silicon atoms, organosilicate glass (OSG), and spin-on dielectric oxide materials. In one embodiment, the first material of the insulating layers 32 can be silicon oxide.

The second material of the sacrificial material layers 42 is a sacrificial material that can be removed selective to the first material of the insulating layers 32. As used herein, a removal of a first material is "selective to" a second material if the removal process removes the first material at a rate that is at least twice the rate of removal of the second material. The ratio of the rate of removal of the first material to the rate of removal of the second material is herein referred to as a "selectivity" of the removal process for the first material with respect to the second material.

As used herein, an "amorphous" aluminum oxide layer has 0 to 49 volume percent, such as 0 to 20 volume percent crystal grains. As used herein, a "crystalline" or "polycrystalline" aluminum oxide layer has 51 to 100 volume percent, such as 80 to 100 percent crystal grains. As used herein, a "very thin" aluminum oxide layer has a thickness of 3 nm or less, such as 0.5 to 2.5 nm, for example 1.5 to 2.5 nm.

Without wishing to be bound by a particular theory, the present inventors recognized that crystallization temperature of very thin amorphous aluminum oxide layers depends on at least one of a thickness of the aluminum oxide layer and a composition of an underlying material on which the amorphous aluminum oxide layer is disposed. For example, after a rapid thermal anneal (RTA) in a temperature range from 850 degrees Celsius and 1,100 degrees Celsius for 15 to 120 seconds, such as 30 to 60 seconds, the very thin amorphous aluminum oxide layer having a thickness of 3 nm or less, such as 0.5 to 2.5 nm, for example 1.5 to 2.5 nm, disposed on a silicon oxide surface remains amorphous while amorphous aluminum oxide disposed on a silicon nitride or a silicon surface crystallizes to form crystalline aluminum oxide.

Without wishing to be bound by a particular theory, the present inventors believe that the very thin amorphous aluminum oxide layer deposited at the same time on silicon nitride and silicon oxide surfaces has a greater thickness on the silicon nitride surface than on the silicon oxide surface. For example, the same very thin amorphous aluminum oxide layer may have a thickness on an underlying silicon nitride surface that is at least 50%, such as 75 to 150% greater than its thickness on the underlying silicon oxide surface. The present inventors believe that crystallization is enhanced for thicker versus thinner portions of the same aluminum oxide layer during an RTA process. Thus, during an RTA of the very thin amorphous aluminum oxide layer, the thicker portions of the layer on the silicon nitride surface crystallize, while the thinner portions of the same layer on the silicon oxide surface remain amorphous.

Without wishing to be bound by a particular theory, the present inventors also believe that the very thin aluminum oxide layer deposited at the same time on silicon and silicon oxide surfaces may have a higher volume of crystal grains in the portion deposited on the silicon surface than in the portion deposited on the silicon oxide surface. Thus, during an RTA anneal of the very thin amorphous aluminum oxide layer, the portions of the layer on the silicon surface which have a mixed amorphous and polycrystalline structure crystallize to have more than 50 volume percent crystal grains, while the more amorphous portions of the same layer on the silicon oxide surface remain amorphous. In other words, the first portions of the amorphous aluminum oxide layer on the silicon surfaces have a higher initial crystalline volume fraction than the second portions of the amorphous aluminum oxide layer on the silicon oxide surfaces, and the first portions of the amorphous aluminum oxide layer are crystallized during the selective crystallization anneal process due to the higher initial crystalline volume fraction while the second portions of the amorphous aluminum oxide layer remain amorphous.

In one embodiment, the sacrificial material layers 42 can include a material on which crystallization of amorphous aluminum oxide can proceed at a lower temperature range than the temperature range at which crystallization of very thin amorphous aluminum oxide can proceed on a semiconductor oxide material (such as silicon oxide) to be subsequently formed at the bottom of each memory opening 49. The second material of the sacrificial material layers 42 can be subsequently replaced with electrically conductive electrodes which can function, for example, as control gate electrodes of a vertical NAND device. Non-limiting examples of the second material include silicon nitride or a semiconductor material, such as silicon (e.g., polysilicon or amorphous silicon). In one embodiment, the sacrificial material layers 42 can be spacer material layers that comprise silicon nitride.

In one embodiment, the insulating layers 32 can include silicon oxide, and sacrificial material layers can include silicon nitride sacrificial material layers. The first material of the insulating layers 32 can be deposited, for example, by chemical vapor deposition (CVD). For example, if silicon oxide is employed for the insulating layers 32, tetraethyl orthosilicate (TEOS) can be employed as the precursor material for the CVD process. The second material of the sacrificial material layers 42 can be formed, for example, CVD or atomic layer deposition (ALD).

The sacrificial material layers 42 can be suitably patterned so that conductive material portions to be subsequently formed by replacement of the sacrificial material layers 42 can function as electrically conductive electrodes, such as the control gate electrodes of the monolithic three-dimensional NAND string memory devices to be subsequently formed. The sacrificial material layers 42 may comprise a portion having a strip shape extending substantially parallel to the top surface of the substrate.

The thicknesses of the insulating layers 32 and the sacrificial material layers 42 can be in a range from 20 nm to 50 nm, although lesser and greater thicknesses can be employed for each insulating layer 32 and for each sacrificial material layer 42. The number of repetitions of the pairs of an insulating layer 32 and a sacrificial material layer (e.g., a control gate electrode or a sacrificial material layer) 42 can be in a range from 2 to 1,024, and typically from 8 to 256, although a greater number of repetitions can also be employed. The top and bottom gate electrodes in the stack may function as the select gate electrodes. In one embodiment, each sacrificial material layer 42 in the alternating stack (32, 42) can have a uniform thickness that is substantially invariant within each respective sacrificial material layer 42.

Optionally, an insulating cap layer 70 can be formed over the alternating stack (32, 42). The insulating cap layer 70 includes a dielectric material that is different from the material of the sacrificial material layers 42. In one embodiment, the insulating cap layer 70 can include a dielectric material that can be employed for the insulating layers 32 as described above. The insulating cap layer 70 can have a greater thickness than each of the insulating layers 32. The insulating cap layer 70 can be deposited, for example, by chemical vapor deposition. In one embodiment, the insulating cap layer 70 can be a silicon oxide layer.

A lithographic material stack (not shown) including at least a photoresist layer can be formed over the insulating cap layer 70 and the alternating stack (32, 42), and can be lithographically patterned to form openings therein. The pattern in the lithographic material stack can be transferred through the insulating cap layer 70 and through entirety of the alternating stack (32, 42) by at least one anisotropic etch that employs the patterned lithographic material stack as an etch mask. Portions of the alternating stack (32, 42) underlying the openings in the patterned lithographic material stack are etched to form first memory openings 49. In other words, the transfer of the pattern in the patterned lithographic material stack through the alternating stack (32, 42) forms the first memory openings that extend through the alternating stack (32, 42). The chemistry of the anisotropic etch process employed to etch through the materials of the alternating stack (32, 42) can alternate to optimize etching of the first and second materials in the alternating stack (32, 42). The anisotropic etch can be, for example, a series of reactive ion etches. Optionally, the gate dielectric layer 12 may be used as an etch stop layer between the alternating stack (32, 42) and the substrate. The sidewalls of the first memory openings can be substantially vertical, or can be tapered. The patterned lithographic material stack can be subsequently removed, for example, by ashing.

A memory stack structure can be formed in each of the memory opening. FIGS. 2A-2H illustrate sequential vertical cross-sectional views of a memory opening during formation of an exemplary memory stack structure. Formation of the exemplary memory stack structure can be performed within each of the memory openings 49 in the exemplary structure illustrated in FIG. 1.

Referring to FIG. 2A, a memory opening 49 is illustrated. The memory opening 49 extends through the insulating cap layer 70, the alternating stack (32, 42), and the gate dielectric layer 12, and optionally into an upper portion of the semiconductor substrate layer 10. The recess depth of the bottom surface of each memory opening 49 with respect to the top surface of the semiconductor substrate layer 10 can be in a range from 0 nm to 30 nm, although greater recess depths can also be employed. Optionally, the sacrificial material layers 42 can be laterally recessed partially to form lateral recesses (not shown), for example, by an isotropic etch.

Referring to FIG. 2B, an epitaxial channel portion 11 can be optionally formed at the bottom of each memory opening 49 by selective epitaxy of a semiconductor material. During the selective epitaxy process, a reactant gas and an etchant gas can be simultaneously or alternatively flowed into a process chamber. Semiconductor surfaces and dielectric surfaces of the exemplary structure provide different nucleation rates for the semiconductor material. By setting the etch rate (determined by the flow of the etchant gas) of the semiconductor material greater than the nucleation rate of the semiconductor material on the dielectric surfaces and less than the nucleation rate of the semiconductor material on the semiconductor surfaces, the semiconductor material can grow from the physically exposed semiconductor surfaces (i.e., from the physically exposed surfaces of the semiconductor substrate layer 10 at the bottom of each memory opening 49). Each portion of the deposited semiconductor material constitutes an epitaxial channel portion 11, which comprises a single crystalline semiconductor material (e.g., single crystalline silicon) in epitaxial alignment with the single crystalline semiconductor material (e.g., single crystalline silicon) of the semiconductor substrate layer 10. Each epitaxial channel portion 11 functions as a portion of a channel of a vertical field effect transistor. The top surface of the epitaxial channel portion 11 can be between a pair of sacrificial material layers 42. In other words, a periphery of each epitaxial channel portion 11 can be in physical contact with a sidewall of an insulating layer 32. A cavity 49' is present over an epitaxial channel portion 11 in each memory opening 49.

Referring to FIG. 2C, a selective etch process can be optionally performed to laterally recess the sacrificial material layers 42 relative to sidewall surfaces of the insulating layers 32 around each memory opening 49. An isotropic etch or an anisotropic etch can be employed. In an illustrative example, the sacrificial material layers 42 can include silicon nitride, the gate dielectric layers 12 can include a silicon oxide material (e.g., silicon dioxide deposited by CVD using a TEOS precursor), the insulating material layers 32 can include silicon oxide, and a wet etch employing hot phosphoric acid can be employed. The lateral recess distance can be in a range from 2 nm to 12 nm (such as from 3 nm to 6 nm), although lesser and greater lateral recess distances can also be employed. In one embodiment, the sidewall surfaces of the sacrificial material layers 42 can be laterally recessed outward (i.e., away from the central axis of the memory opening 49) by the same lateral recess distance from the sidewall surfaces of the insulating layers 32.

Referring to FIG. 2D, a surface portion of the semiconductor material underlying a semiconductor surface at the bottom of each memory opening 49 can be converted into a horizontal semiconductor oxide portion 13 by oxidizing the semiconductor material underlying the semiconductor surface. If an epitaxial channel portion 11 is present at the bottom of each memory opening 49, a top portion of the epitaxial channel portion 11 can be converted into the horizontal semiconductor oxide portion 13 by an oxidation process. For example, if the epitaxial channel portion 11 includes single crystalline silicon, the horizontal semiconductor oxide portion 13 can include silicon oxide. The oxidation process can be a thermal oxidation process or a plasma oxidation process. The thickness of the horizontal semiconductor oxide portion 13 can be in a range from 2 nm to 30 nm (such as from 3 nm to 10 nm), although lesser and greater thicknesses can also be employed. The silicon nitride layers 42 are not substantially oxidized.

Referring to FIG. 2E, a very thin amorphous aluminum oxide layer 410L can be deposited on the physically exposed surfaces of each memory opening 49, which includes sidewall surfaces of the insulating layers 32, sidewall surfaces of the sacrificial material layers 42 (which may or may not be recessed outward with respect to the sidewalls of the insulating layers 32), and the top surface of the horizontal semiconductor oxide portion 13. The amorphous aluminum oxide layer 410L can be deposited by an atomic layer deposition (ALD) process that employs a reactant and an oxidizer. For example, a reactant such as trimethylaluminum (TMA) and water vapor ($H_2O$) can be alternately flowed into a process chamber with a low base pressure (which can be in the ultrahigh vacuum range), and maintained at a predetermined pressure range (which can be in a range, for example, from 1 Torr to 100 Torr, although lesser and greater pressures can also be employed). The process temperature of the ALD process can be, for example, in a range from 50 degrees Celsius to 250 degrees Celsius, although lower and higher temperatures can also be employed. The thickness of the deposited very thin amorphous aluminum oxide layer 410L can be in a range from 0.5 to 3 nm, such as 1.5 to 2.5 nm, although lesser and greater thicknesses can also be employed. While an amorphous aluminum oxide layer 410L of a uniform thickness is shown in FIG. 2E, the thickness of layer 410L may be non-uniform. For example, portions of layer 410L deposited on the sacrificial material (e.g., silicon nitride) layers 42 may be thicker than portions of layer 410L deposited in the insulating material (e.g., silicon oxide) layers 42.

The amorphous aluminum oxide layer 410L can be deposited conformally on sidewalls of the memory opening 49. The amorphous aluminum oxide layer 410L can include first vertical amorphous aluminum oxide portions that are deposited on the sidewalls of the sacrificial material layers 42, second vertical amorphous aluminum oxide portions that are deposited on the sidewalls of the insulating layers 32, and horizontal amorphous aluminum oxide portions that are deposited on the top surface of each horizontal semiconductor oxide portion 13 at the bottom of a respective memory opening 49. A cavity 49', which is herein referred to as a memory cavity or a front side cavity, is formed in the unfilled volume of the respective memory opening 49.

Referring to FIG. 2F, a selective crystallization anneal process may be performed on the exemplary structure including the amorphous aluminum oxide layer 410L. As used herein, a "selective crystallization anneal process" is an anneal process in which crystallization of a material portion depends on the thickness of the material layer and/or on the surface on which the material portion is located. The elevated temperature of the selective crystallization anneal process can be selected such that crystallization of a first amorphous portion of a material proceeds on surfaces of a first type, while crystallization of a second amorphous portion of the material does not occur on surfaces of a second type. For example, the first vertical amorphous aluminum oxide portions located on the sidewalls of the sacrificial material layers 42 (which can be silicon nitride layers) can be crystallized into respective crystalline aluminum oxide portions at the anneal temperature (which can be an RTA conducted at 850 degrees Celsius to 1,100 degrees Celsius, such as 900 to 1,000 degrees Celsius for 15 to 120 seconds, such as 30 to 60 seconds), while the second vertical amorphous aluminum oxide portions located on the sidewalls of the insulating layers 32 (which can be silicon oxide layers) and the horizontal amorphous aluminum oxide portion contacting the horizontal semiconductor oxide portion 13 are not crystallized in each memory opening. In other words, first portions of the amorphous aluminum oxide layer 410L on the sidewall surfaces of the sacrificial material layer 42 are crystallized into crystalline aluminum oxide portions 41C, while second portions of the amorphous aluminum oxide layer 410L on the sidewalls of the insulating layers 32 remain as amorphous aluminum oxide portions 41U and the horizontal aluminum oxide portions located on the horizontal semiconductor oxide portion 13 remains as a horizontal amorphous aluminum oxide portion 41H. The annealed aluminum oxide layer 410 includes crystalline aluminum oxide portions 41C, amorphous aluminum oxide portions 41U, and horizontal amorphous aluminum oxide portions 41H. While silicon oxide sacrificial material layers 42 are described above, the same or similar effect may be obtained with silicon sacrificial material layers 42.

Figure 2H:
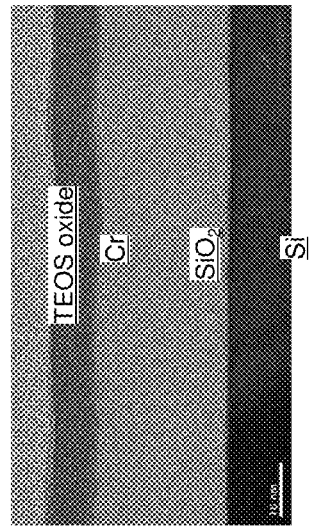
FIG. 2H is a transmission electron micrograph of a second sample formed by depositing and annealing amorphous aluminum oxide on a silicon oxide surface and subsequently etching the amorphous aluminum oxide from the silicon oxide surface according to an embodiment of the present disclosure.
Figure 2G:
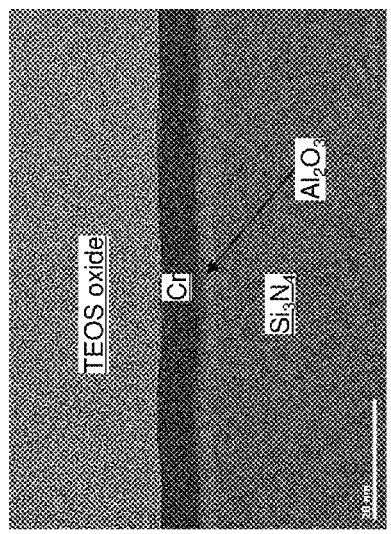
FIG. 2G is a transmission electron micrograph of a first sample formed by depositing and crystallizing amorphous aluminum oxide on a silicon nitride surface and subsequently subjecting the crystallized aluminum oxide to a dilute hydrofluoric etch process according to an embodiment of the present disclosure.

FIG. 2G is a transmission electron micrograph of a first sample formed by depositing and crystallizing amorphous aluminum oxide on a silicon nitride surface and subsequently subjecting the crystallized aluminum oxide to a dilute hydrofluoric acid etch process according to an embodiment of the present disclosure. The amorphous aluminum oxide material was deposited employing an ALD process. The thickness of the deposited amorphous aluminum oxide material was about 2 to 3 nm. The elevated temperature of the selective crystallization anneal (i.e., RTA) process was 1000 degrees Celsius, and the duration of the elevated temperature was 30 seconds. Nitrogen ambient was employed during the selective crystallization anneal process. The crystallized aluminum oxide material was subjected to a wet etch process for 60 seconds. The wet etch process employed dilute hydrofluoric acid in which hydrofluoric acid and deionized water was mixed at a volume ratio of 1 to 50. Subsequently, chromium and a TEOS oxide (silicon oxide deposited by employing tetraethylorthosilicate (TEOS) as a precursor gas) were sequentially deposited for sample preparation before generating the transmission electron micrograph of FIG. 2G. Presence of the crystallized aluminum oxide material after the wet etch process is verified in the transmission electron micrograph of FIG. 2G.

FIG. 2H is a transmission electron micrograph of a second sample formed by depositing and annealing an about 2 nm thick amorphous aluminum oxide on a silicon oxide surface and subsequently etching the amorphous aluminum oxide from the silicon oxide surface. The amorphous aluminum oxide material was deposited on the silicon oxide surface employing the same ALD process as the first sample. Subsequently, the second sample was subjected to the same selective crystallization anneal process as the first sample, and was subjected to the same wet etch process as the first sample. The same sample preparation process was employed to generate the second sample, and the transmission electron micrograph of FIG. 2H was generated. All aluminum oxide and about 10 nanometers of the underlying silicon oxide were etched away. Absence of any aluminum oxide material is verified in the transmission electron micrograph of FIG. 2H.

Figure 2I:
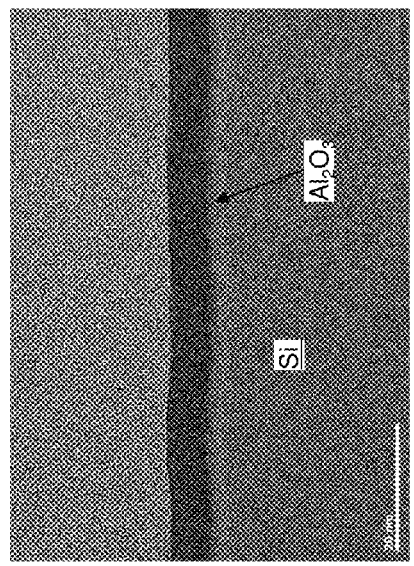
FIG. 2I is a transmission electron micrograph of a third sample formed by depositing and crystallizing amorphous aluminum oxide on a silicon surface and subsequently subjecting the crystallized aluminum oxide to a dilute hydrofluoric etch process according to an embodiment of the present disclosure.

FIG. 2I is a transmission electron micrograph of a third sample formed by depositing and crystallizing a 1.5 to 2 nm thick amorphous aluminum oxide on a silicon surface and subsequently subjecting the crystallized aluminum oxide to a dilute hydrofluoric acid etch process according to an embodiment of the present disclosure. The elevated temperature of the selective crystallization anneal (i.e., RTA) process was 1000 degrees Celsius, and the duration of the elevated temperature was 30 seconds. Nitrogen ambient was employed during the selective crystallization anneal process. The crystallized aluminum oxide material was subjected to a wet etch process for 60 seconds. The wet etch process employed dilute hydrofluoric acid in which hydrofluoric acid and deionized water was mixed at a volume ratio of 1 to 50. Presence of the crystallized aluminum oxide material after the wet etch process is verified in the transmission electron micrograph of FIG. 2I.

Without wishing to be bound by a particular theory, it is believed that the transmission electron micrographs of FIGS. 2G, 2H and 2I collectively demonstrate the operational principle of a selective crystallization process that can be performed on amorphous aluminum oxide that can be employed to crystallize first portions of an amorphous aluminum oxide material while second portions of the amorphous aluminum oxide material remain amorphous. These micrographs also demonstrate that the amorphous aluminum oxide may be selectively wet etched compared to the crystalline aluminum oxide to leave aluminum oxide blocking dielectric portions adjacent to the positions where the control gate electrodes will be formed in a subsequent process steps.

While it is believed that selective aluminum oxide crystallization may be responsible for permitting selective wet etching of different portions of the aluminum oxide layer, there may be other mechanisms that permit selective wet etching of different portions of the aluminum oxide layer in addition to or instead of the selective crystallization. Without wishing to be bound by a particular theory, it is believed that there may be some small material differences in the as-deposited portions of the aluminum oxide layer 410L that are deposited on silicon nitride or silicon layers 42 versus the as-deposited portions of the aluminum oxide layer 410L that are deposited on silicon oxide layers 32. These material differences may permit selective wet etching of different portions of the aluminum oxide layer with or without the above described recrystallization. Without wishing to be bound by a particular theory, it is believed that the material composition of the as-deposited aluminum oxide layer is substrate (i.e., underlying layer) dependent, and this dependency is enhanced at lower aluminum oxide deposition temperatures (see, e.g., L. Lamagna, et al., Chem. Mater. 2012, 24, 1080-1090). These material differences may become more significant for thinner (e.g., having a thickness of less than 5 nm) versus thick aluminum oxide layers because the substrate plays a greater role for thin layers. Without wishing to be bound by a particular theory, it is believed that these material differences of aluminum oxide layer 410L portions deposited on silicon or silicon nitride sacrificial material layers 42 versus portions deposited on silicon oxide insulating layers 32, either acting independently or in conjunction with the selective crystallization lead to greater etch resistance of the portions of the aluminum oxide layer deposited on the sacrificial material layers 42 compared to portions of the aluminum oxide layer deposited on the insulating layers 32.

Referring to FIG. 2J, a selective etch process, such as a wet etch process, can be employed to etch the aluminum oxide portions of the aluminum oxide layer located on the insulating layers 32 selective to the aluminum oxide portions of the aluminum oxide layer located on the sacrificial material layers 42. Thus, the aluminum oxide portions on layers 32 are removed at a greater etch rate than the aluminum oxide portions on layers 42 employing the selective etch process. For example, in one embodiment, the selective etch process, such as a wet etch process, can be employed to etch the amorphous aluminum oxide portions of layer 410 located on the insulating layers 32 selective to the crystalline aluminum oxide portions of layer 410 located on the sacrificial material layers 42. Thus, the amorphous aluminum oxide portions are removed at a greater etch rate than the crystalline aluminum oxide portions employing the selective etch process. The etch process may be an isotropic etch process. Non-limiting examples of etch chemistries that can be employed for the selective etch process include (i) a mixture of ammonium hydroxide, hydrogen peroxide, and water; or (ii) dilute hydrofluoric acid. All or a predominant portion (i.e., 51 to 100%, such as 80-100% of the initial thickness) of each crystalline aluminum oxide portion remains after removal of the amorphous aluminum oxide portions. Thus, a crystalline aluminum oxide portion 41C remains at each level of the sacrificial material layers 42 around each cavity 49', while the second vertical portions 41U of the amorphous aluminum oxide layer 410L at each level of the insulating layers 32 and the horizontal amorphous aluminum oxide portion 41H on top of the horizontal semiconductor oxide portion 13 are completely removed by the selective etch process. The amorphous horizontal aluminum oxide portion 41H on top of the horizontal semiconductor oxide portion 13 and the second vertical portions 41U of the amorphous aluminum oxide layer 410L as deposited at the processing steps of FIG. 2E can be simultaneously removed.

Thus, the process of the embodiments of the present disclosure permits use of a relatively easy aluminum oxide wet etch to selectively remove the aluminum oxide from the bottom of the memory opening 49 without resorting to the more difficult reactive dry etch of the aluminum oxide. Furthermore, the selective separation of the continuous aluminum oxide layer during the selective wet etching into discrete, vertically separated crystalline aluminum oxide blocking dielectric segments 41C improves the memory device program data retention because a continuous charge path between vertically separated memory cells in a continuous aluminum oxide layer is eliminated.

Referring to FIG. 2K, surface portions of the sacrificial material layers 42 that are proximal to the crystalline aluminum oxide portions 41C may be optionally converted into silicon oxide-containing portions 41O by diffusing oxygen through the crystalline aluminum oxide portions 41C into the surface portions of the sacrificial material layers 42. For example, a thermal oxidation process, such as in-situ steam generation (ISSG), can be performed in induce diffusion of oxygen atoms through the crystallize aluminum oxide portions 41C into the surface portions of the sacrificial material layers 42. If the sacrificial material layers 42 include silicon nitride, the silicon nitride material of the sacrificial material layers 42 in proximity to the crystalline aluminum oxide portions 41C is converted into silicon oxide-containing portions. As used herein, a silicon oxide-containing material refers to a dielectric material including a dielectric compound of silicon such that oxygen is the predominant non-silicon material. A silicon oxide-containing material can include silicon oxide and/or silicon oxynitride. In one embodiment, each of the silicon oxide-containing portions 41O can include a silicon oxynitride portion having a radial nitrogen concentration gradient around the memory opening 49. Specifically, the nitrogen concentration of the silicon oxynitride in the silicon oxide-containing portions 41O can increase radially, i.e., with a lateral distance from the memory opening. Each adjoining pair of a silicon oxide-containing portion 41O and a crystalline aluminum oxide portion 41C constitutes an annular spacer structure 41 that is located at the level of a respective sacrificial material layer 42 and laterally surrounding a respective cavity 49'.

Referring to FIG. 2L, an etch process can be employed to remove the horizontal semiconductor oxide portion 13. For example, a wet etch employing hydrofluoric acid can be employed to remove the horizontal semiconductor oxide portion 13 from the bottom of each memory opening.

A series of layers including an optional blocking dielectric layer 503L, a continuous memory material layer 504L, a tunneling dielectric layer 506L, and an optional first semiconductor channel layer 601L can be sequentially deposited in the memory openings 49. The blocking dielectric layer 503L can be deposited directly on the surfaces of a semiconductor material in, or on, the semiconductor substrate 10, which can be, for example, the top surface of the epitaxial channel portion 11. Further, the blocking dielectric layer 503 can be deposited directly on the inner sidewalls of the crystalline aluminum oxide portion 41C and on the sidewalls of the insulator layers 32. The blocking dielectric layer 503L can include a dielectric material that is different from aluminum oxide. In one embodiment, the blocking dielectric layer 503L can include silicon oxide. The blocking dielectric layer 503L can be formed by a conformal deposition method such as low pressure chemical vapor deposition, atomic layer deposition, or a combination thereof. The thickness of the blocking dielectric layer 503L can be in a range from 1 nm to 20 nm, although lesser and greater thicknesses can also be employed.

The continuous memory material layer 504L, the tunneling dielectric layer 506L, and the optional first semiconductor channel layer 601L can be sequentially formed. In one embodiment, the continuous memory material layer 504L can be a charge trapping material including a dielectric charge trapping material, which can be, for example, silicon nitride. Alternatively, the continuous memory material layer 504L can include a conductive material such as doped polysilicon or a metallic material that is patterned into multiple electrically isolated portions (e.g., floating gates), for example, by being formed within lateral recesses into sacrificial material layers 42. In one embodiment, the continuous memory material layer 504L includes a silicon nitride layer.

The continuous memory material layer 504L can be formed as a single memory material layer of homogeneous composition, or can include a stack of multiple memory material layers. The multiple memory material layers, if employed, can comprise a plurality of spaced-apart floating gate material layers that contain conductive materials (e.g., metal such as tungsten, molybdenum, tantalum, titanium, platinum, ruthenium, and alloys thereof, or a metal silicide such as tungsten silicide, molybdenum silicide, tantalum silicide, titanium silicide, nickel silicide, cobalt silicide, or a combination thereof) and/or semiconductor materials (e.g., polycrystalline or amorphous semiconductor material including at least one elemental semiconductor element or at least one compound semiconductor material). Alternatively or additionally, the continuous memory material layer 504L may comprise an insulating charge trapping material, such as one or more silicon nitride segments. Alternatively, the continuous memory material layer 504L may comprise conductive nanoparticles such as metal nanoparticles, which can be, for example, ruthenium nanoparticles. The continuous memory material layer 504L can be formed, for example, by chemical vapor deposition (CVD), atomic layer deposition (ALD), physical vapor deposition (PVD), or any suitable deposition technique for storing electrical charges therein. The thickness of the continuous memory material layer 504L can be in a range from 2 nm to 20 nm, although lesser and greater thicknesses can also be employed.

The tunneling dielectric layer 506L includes a dielectric material through which charge tunneling can be performed under suitable electrical bias conditions. The charge tunneling may be performed through hot-carrier injection or by Fowler-Nordheim tunneling induced charge transfer depending on the mode of operation of the monolithic three-dimensional NAND string memory device to be formed. The tunneling dielectric layer 506L can include silicon oxide, silicon nitride, silicon oxynitride, dielectric metal oxides (such as aluminum oxide and hafnium oxide), dielectric metal oxynitride, dielectric metal silicates, alloys thereof, and/or combinations thereof. In one embodiment, the tunneling dielectric layer 506L can include a stack of a first silicon oxide layer, a silicon oxynitride layer, and a second silicon oxide layer, which is commonly known as an ONO stack. In one embodiment, the tunneling dielectric layer 506L can include a silicon oxide layer that is substantially free of carbon or a silicon oxynitride layer that is substantially free of carbon. The thickness of the tunneling dielectric layer 506L can be in a range from 2 nm to 20 nm, although lesser and greater thicknesses can also be employed.

The optional first semiconductor channel layer 601L includes a semiconductor material such as at least one elemental semiconductor material, at least one III-V compound semiconductor material, at least one II-VI compound semiconductor material, at least one organic semiconductor material, or other semiconductor materials known in the art. In one embodiment, the first semiconductor channel layer 601L includes amorphous silicon or polysilicon. The first semiconductor channel layer 601L can be formed by a conformal deposition method such as low pressure chemical vapor deposition (LPCVD). The thickness of the first semiconductor channel layer 601L can be in a range from 2 nm to 10 nm, although lesser and greater thicknesses can also be employed. A cavity 49' is formed in the volume of each memory opening 49 that is not filled with the deposited material layers (503L, 504L, 506L, 601L).

Referring to FIG. 2M, the optional first semiconductor channel layer 601L, the tunneling dielectric layer 506L, the continuous memory material layer 504, the blocking dielectric layer 503L are sequentially anisotropically etched employing at least one anisotropic etch process. The portions of the first semiconductor channel layer 601L, the tunneling dielectric layer 506L, the continuous memory material layer 504L, and the blocking dielectric layer 503 located above the top surface of the insulating cap layer 70 can be removed by the at least one anisotropic etch process. Further, the horizontal portions of the first semiconductor channel layer 601L, the tunneling dielectric layer 506L, the continuous memory material layer 504L, and the blocking dielectric layer 503L at a bottom of each cavity 49' can be removed to form openings in remaining portions thereof. Each of the first semiconductor channel layer 601L, the tunneling dielectric layer 506L, the continuous memory material layer 504, and the blocking dielectric layer 503L can be etched by anisotropic etch process.

Each remaining portion of the first semiconductor channel layer 601L constitutes a first semiconductor channel portion 601. Each remaining portion of the tunneling dielectric layer 506L constitutes a tunneling dielectric 506. Each remaining portion of the continuous memory material layer 504L is herein referred to as a memory material layer 504. The memory material layer 504 can comprise a charge trapping material or a floating gate material. In one embodiment, each memory material layer 504 can include a vertical stack of charge storage regions that store electrical charges upon programming. In one embodiment, the memory material layer 504 can be a charge storage layer in which each portion adjacent to the sacrificial material layers 42 constitutes a charge storage region. Each remaining portion of the blocking dielectric layer 503L is herein referred to as a blocking dielectric 503.

A surface of the epitaxial channel portion 11 (or a surface of the semiconductor substrate layer 10 in case the epitaxial channel portions 11 are not employed) can be physically exposed underneath the opening through the first semiconductor channel portion 601, the tunneling dielectric 506, the memory material layer 504, and the blocking dielectric 503. Optionally, the physically exposed semiconductor surface at the bottom of each cavity 49' can be vertically recessed so that the recessed semiconductor surface underneath the cavity 49' is vertically offset from the topmost surface of the epitaxial channel portion 11 (or of the semiconductor substrate layer 10 in case epitaxial channel portions 11 are not employed) by a recess distance. A tunneling dielectric 506 is located over the memory material layer 504. A set of a blocking dielectric 503, a memory material layer 504, and a tunneling dielectric 506 in a memory opening 49 constitutes a memory film 50, which includes a plurality of charge storage regions (as embodied as the memory material layer 504) that are insulated from surrounding materials by the blocking dielectric 503 and the tunneling dielectric 506.

In one embodiment, the first semiconductor channel portion 601, the tunneling dielectric 506, the memory material layer 504, and the second blocking dielectric 503 can have vertically coincident sidewalls around the area in which the top surface of an epitaxial channel portion 11 is physically exposed. As used herein, a first surface is "vertically coincident" with a second surface if there exists a vertical plane including both the first surface and the second surface. Such a vertical plane may, or may not, have a horizontal curvature, but does not include any curvature along the vertical direction, i.e., extends straight up and down.

Figure 2O:
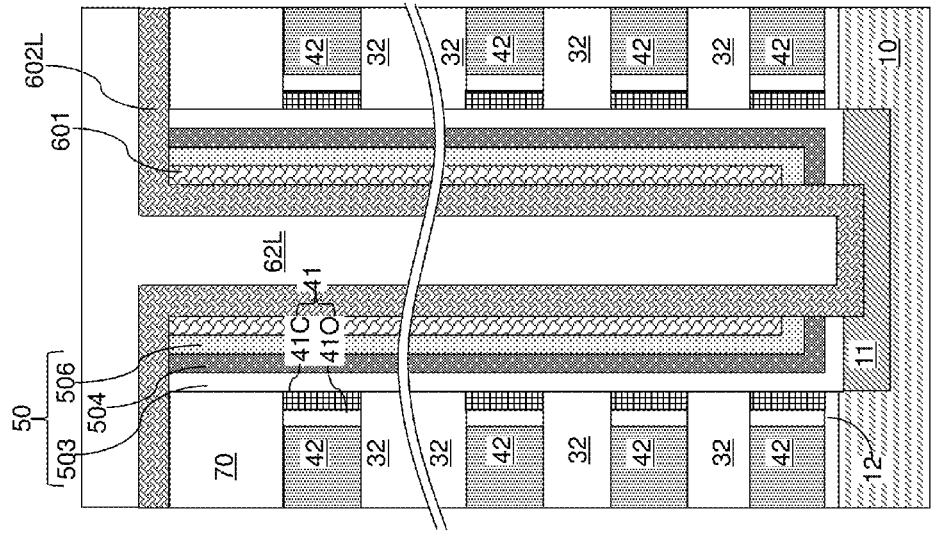
Figure 2N:
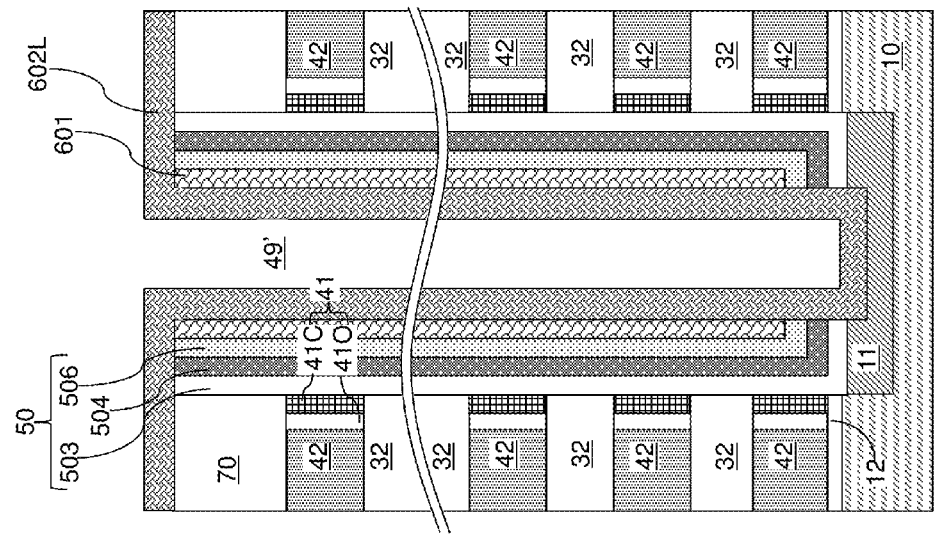

Referring to FIG. 2N, a second semiconductor channel layer 602L can be deposited directly on the semiconductor surface of the epitaxial channel portion 11 or the semiconductor substrate layer 10 if portion 11 is omitted, and directly on the first semiconductor channel portion 601. The second semiconductor channel layer 602L includes a semiconductor material such as at least one elemental semiconductor material, at least one III-V compound semiconductor material, at least one II-VI compound semiconductor material, at least one organic semiconductor material, or other semiconductor materials known in the art. In one embodiment, the second semiconductor channel layer 602L includes amorphous silicon or polysilicon. The second semiconductor channel layer 602L can be formed by a conformal deposition method such as low pressure chemical vapor deposition (LPCVD). The thickness of the second semiconductor channel layer 602L can be in a range from 2 nm to 10 nm, although lesser and greater thicknesses can also be employed. The second semiconductor channel layer 602L may partially fill the cavity 49' in each memory opening, or may fully fill the cavity in each memory opening.

The materials of the first semiconductor channel portion 601 and the second semiconductor channel layer 602L are collectively referred to as a semiconductor channel material. In other words, the semiconductor channel material is a set of all semiconductor material in the first semiconductor channel portion 601 and the second semiconductor channel layer 602L.

Referring to FIG. 2O, in case the cavity 49' in each memory opening is not completely filled by the second semiconductor channel layer 602L, a dielectric core layer 62L can be deposited in the cavity 49' to fill any remaining portion of the cavity 49' within each memory opening. The dielectric core layer 62L includes a dielectric material such as silicon oxide or organosilicate glass. The dielectric core layer 62L can be deposited by a conformal deposition method such as low pressure chemical vapor deposition (LPCVD), or by a self-planarizing deposition process such as spin coating.

Figure 2P:
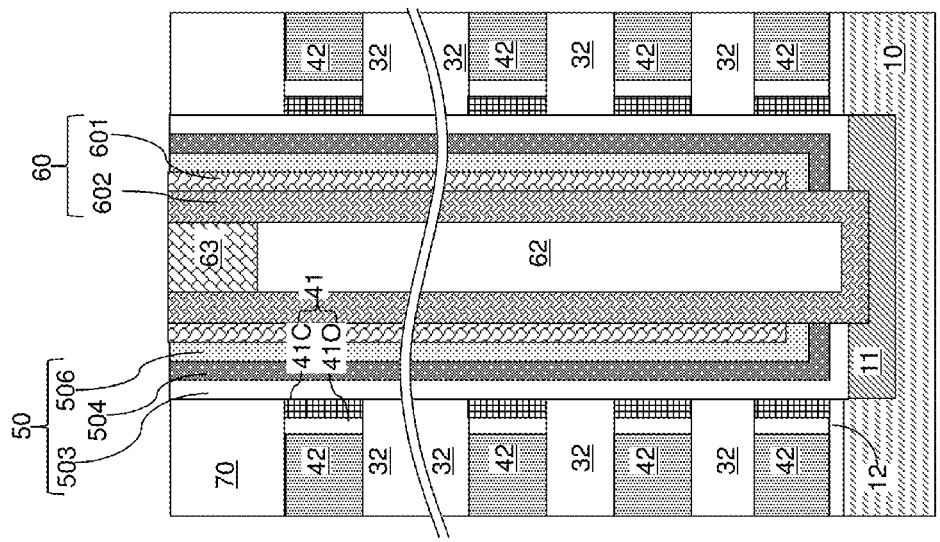

Referring to FIG. 2P, the horizontal portion of the dielectric core layer 62L can be removed, for example, by a recess etch from above the top surface of the insulating cap layer 70. Each remaining portion of the dielectric core layer 62L constitutes a dielectric core 62. Further, the horizontal portion of the second semiconductor channel layer 602L located above the top surface of the insulating cap layer 70 can be removed by a planarization process, which can employ a recess etch or chemical mechanical planarization (CMP). Each remaining portion of the second semiconductor channel layer 602L within a memory opening constitutes a second semiconductor channel portion 602.

Each adjoining pair of a first semiconductor channel portion 601 and a second semiconductor channel portion 602 can collectively form a semiconductor channel 60 through which electrical current can flow when a vertical NAND device including the semiconductor channel 60 is turned on. A tunneling dielectric 506 is surrounded by a memory material layer 504, and laterally surrounds a portion of the semiconductor channel 60. Each adjoining set of a blocking dielectric 503, a memory material layer 504, and a tunneling dielectric 506 collectively constitute a memory film 50, which can store electrical charges with a macroscopic retention time. As used herein, a macroscopic retention time refers to a retention time suitable for operation of a memory device as a permanent memory device such as a retention time in excess of 24 hours.

Figure 2Q:
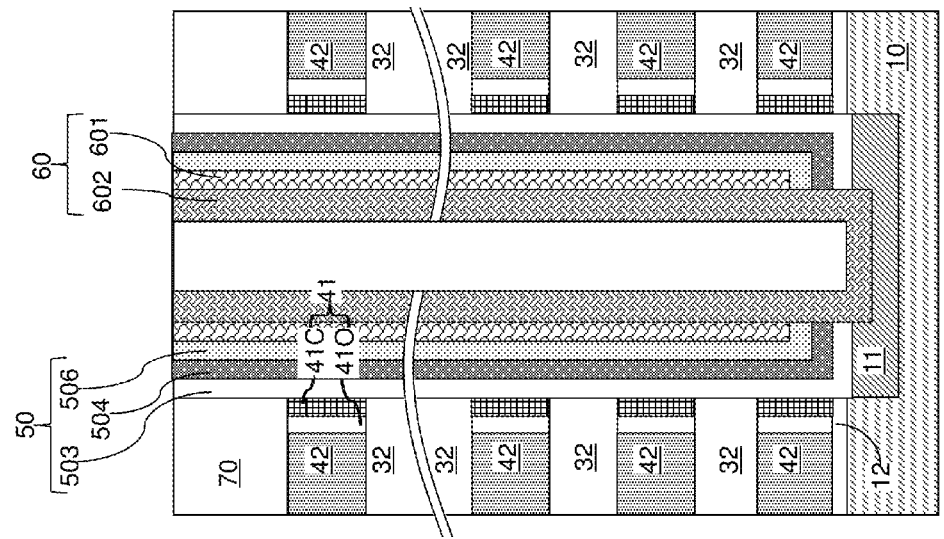

Referring to FIG. 2Q, the top surface of each dielectric core 62 can be further recessed within each memory opening, for example, by a recess etch to a depth that is located between the top surface of the insulating cap layer 70 and the bottom surface of the insulating cap layer 70. Drain regions 63 can be formed by depositing a doped semiconductor material within each recessed region above the dielectric cores 62. The doped semiconductor material can be, for example, doped polysilicon. Excess portions of the deposited semiconductor material can be removed from above the top surface of the insulating cap layer 70, for example, by chemical mechanical planarization (CMP) or a recess etch to form the drain regions 63.

In one embodiment, the atomic concentration of nitrogen increases with a lateral distance from the respective crystalline aluminum oxide portion 41C within each of the silicon oxynitride portion in the silicon oxide-containing portions 40O. In one embodiment, the inner sidewall of each crystalline aluminum oxide portion 41C can contact a portion of an outer sidewall of the memory stack structure 55. In one embodiment, each memory stack structure 55 comprises a blocking dielectric 503 laterally surrounding the vertical stack of charge storage regions as embodied in a memory material layer 504. The outer sidewall of the memory stack structure 55 can be an outer sidewall of the blocking dielectric 503.

An epitaxial channel portion 11 can be in contact with a single crystalline semiconductor material in the substrate 10, with a bottom surface of the semiconductor channel 60, and with an annular bottom surface of the blocking dielectric 503. In one embodiment, each of the plurality of crystalline aluminum oxide portions 41C has an annular shape and encloses a respective memory stack structure 55 therein. Each of the plurality of silicon oxide-containing portions 41O can have an annular shape. As used herein, an "annular shape" refers to a shape that is topologically homeomorphic to a torus, i.e., a shape that can be continuously stretched into a torus without creating a new hole or destroying any pre-existing hole.

Figure 3:
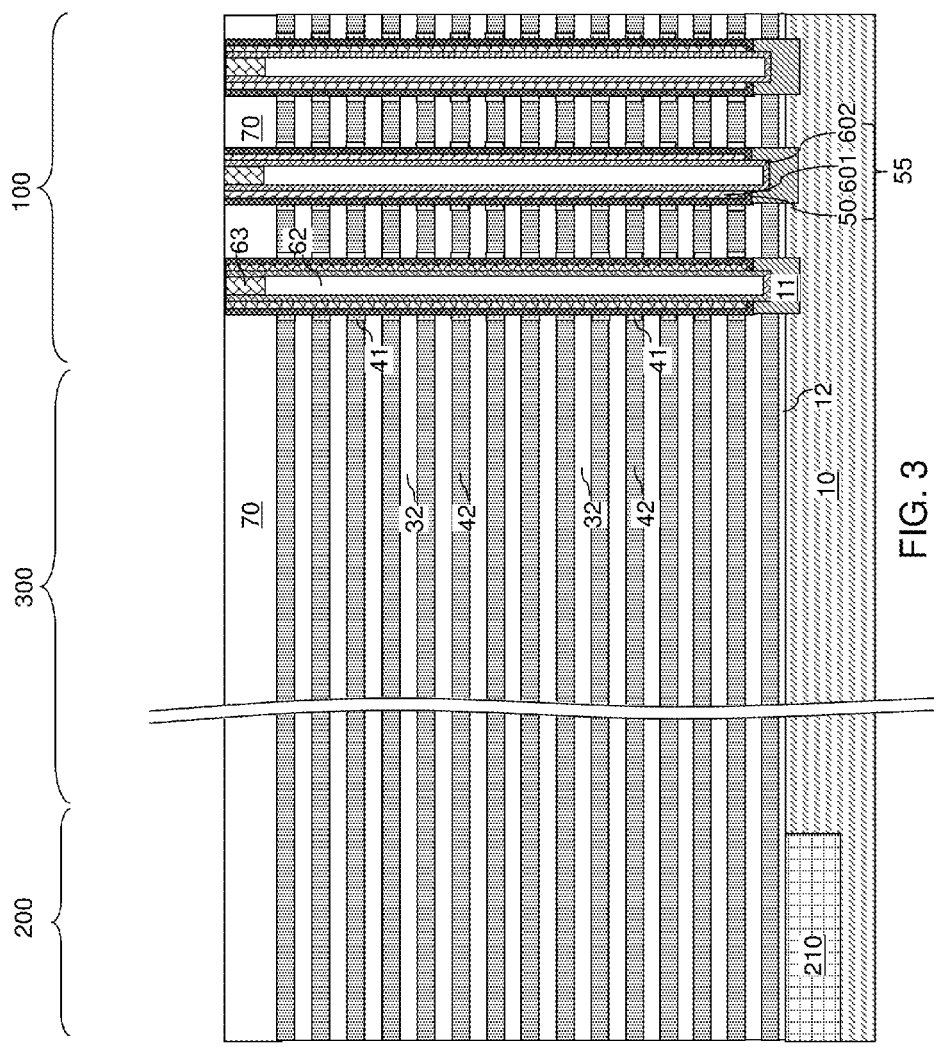
FIG. 3 is a vertical cross-sectional view of the exemplary structure after formation of memory stack structures according to an embodiment of the present disclosure.

The exemplary memory stack structure 55 can be embedded into the exemplary structure illustrated in FIG. 1. FIG. 3 illustrates the exemplary structure that incorporates multiple instances of the exemplary memory stack structure of FIG. 2Q. Each exemplary memory stack structure 55 includes a semiconductor channel 60 which in one embodiment comprises layers 601, 602, a tunneling dielectric layer 506 laterally surrounding the semiconductor channel 60, and a vertical stack of charge storage regions laterally surrounding the tunneling dielectric layer 506 (as embodied as a memory material layer 504). The exemplary structure includes a semiconductor device, which comprises a stack (32, 42) including an alternating plurality of material layers (e.g., the sacrificial material layers 42) and insulating layers 32 located over a semiconductor substrate (e.g., over the semiconductor substrate layer 10), and a memory opening extending through the stack (32, 42). While the present disclosure is described employing the illustrated configuration for the memory stack structure, the methods of the present disclosure can be applied to alternative memory stack structures.

Figure 4:
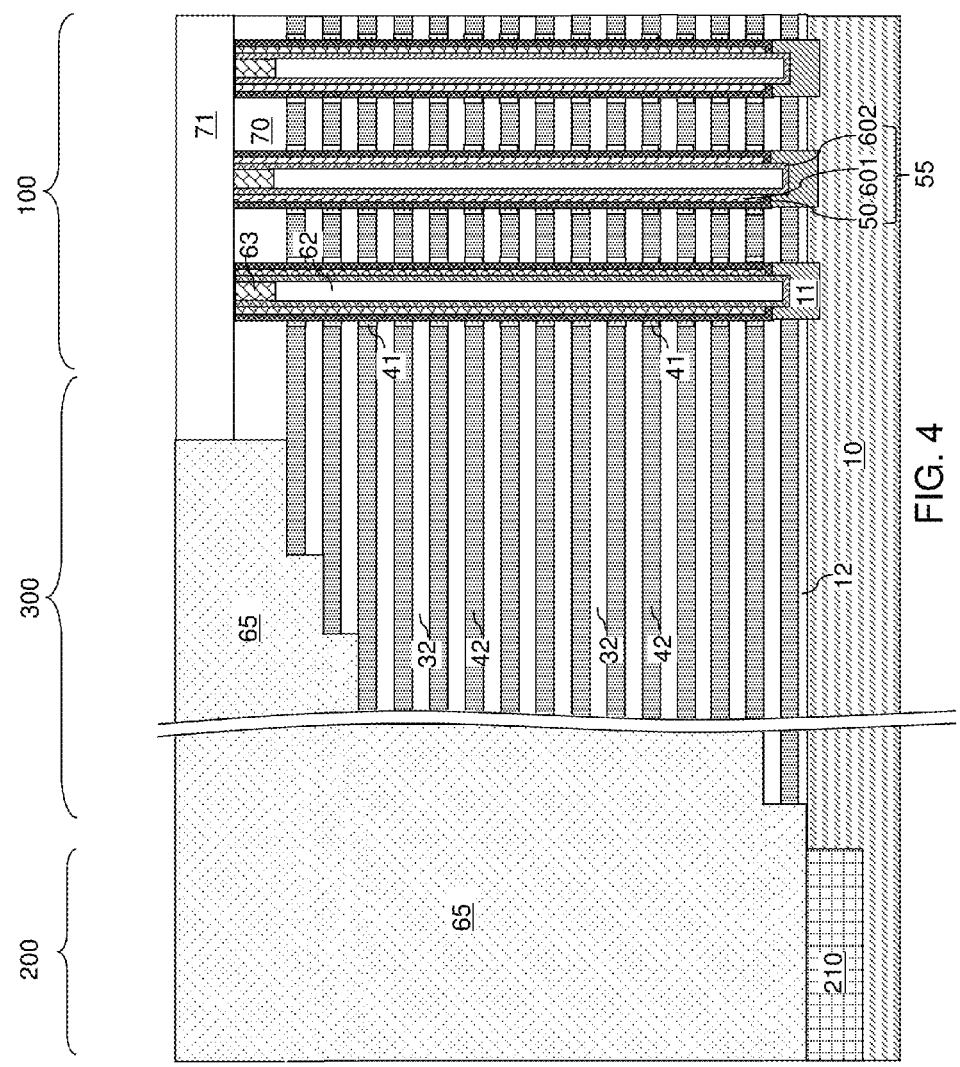
FIG. 4 is a vertical cross-sectional view of the exemplary structure after formation of a set of stepped surfaces and a retro-stepped dielectric material portion according to an embodiment of the present disclosure.

Referring to FIG. 4, an optional first contact level dielectric layer 71 can be formed over the semiconductor substrate layer 10. As an optional structure, the first contact level dielectric layer 71 may, or may not, be formed. In case the first contact level dielectric layer 71 is formed, the first contact level dielectric layer 71 includes a dielectric material such as silicon oxide, silicon nitride, silicon oxynitride, porous or non-porous organosilicate glass (OSG), or a combination thereof. If an organosilicate glass is employed, the organosilicate glass may, or may not, be doped with nitrogen. The first contact level dielectric layer 71 can be formed over a horizontal plane including the top surface of the insulating cap layer 70 and the top surfaces of the drain regions 63. The first contact level dielectric layer 71 can be deposited by chemical vapor deposition, atomic layer deposition (ALD), spin-coating, or a combination thereof. The thickness of the first contact level dielectric layer 71 can be in a range from 10 nm to 300 nm, although lesser and greater thicknesses can also be employed.

In one embodiment, the first contact level dielectric layer 71 can be formed as a dielectric material layer having a uniform thickness throughout. The first contact level dielectric layer 71 may be formed as a single dielectric material layer, or can be formed as a stack of a plurality of dielectric material layers. Alternatively, formation of the first contact level dielectric layer 71 may be merged with formation of at least one line level dielectric layer (not shown). While the present disclosure is described employing an embodiment in which the first contact level dielectric layer 71 is a structure separate from an optional second contact level dielectric layer or at least one line level dielectric layer to be subsequently deposited, embodiments in which the first contact level dielectric layer 71 and at least one line level dielectric layer are formed at a same processing step, and/or as a same material layer, are expressly contemplated herein.

In one embodiment, the first contact level dielectric layer 71, the insulating cap layer 70, and the alternating stack (32, 42) can be removed from the peripheral device region 200, for example, by a masked etch process. In addition, a stepped cavity can be formed within the contact region 300 by patterning a portion of the alternating stack (32, 42). As used herein, a "stepped cavity" refers to a cavity having stepped surfaces. As used herein, "stepped surfaces" refer to a set of surfaces that include at least two horizontal surfaces and at least two vertical surfaces such that each horizontal surface is adjoined to a first vertical surface that extends upward from a first edge of the horizontal surface, and is adjoined to a second vertical surface that extends downward from a second edge of the horizontal surface. A "step" refers to a vertical shift in the height of a set of adjoined surfaces.

The stepped cavity can have various stepped surfaces such that the horizontal cross-sectional shape of the stepped cavity changes in steps as a function of the vertical distance from the top surface of the semiconductor substrate layer 10. In one embodiment, the stepped cavity can be formed by repetitively performing a set of processing steps. The set of processing steps can include, for example, an etch process of a first type that vertically increases the depth of a cavity by one or more levels, and an etch process of a second type that laterally expands the area to be vertically etched in a subsequent etch process of the first type. As used herein, a "level" of a structure including alternating stack is defined as the relative position of a pair of a first material layer and a second material layer within the structure. After formation of all stepped surfaces, mask material layers employed to form the stepped surfaces can be removed, for example, by ashing. Multiple photoresist layers and/or multiple etch processes can be employed to form the stepped surfaces.

A dielectric material such as silicon oxide is deposited in the stepped cavity and over the peripheral devices 210 in the peripheral device region 200. Excess portions of the deposited dielectric material can be removed from above the top surface of the first contact level dielectric layer 71, for example, by chemical mechanical planarization (CMP). The remaining portion of the deposited dielectric material filling the stepped cavity in the contact region 300 and overlying the semiconductor substrate layer 10 in the peripheral device region 200 constitutes a retro-stepped dielectric material portion 65. As used herein, a "retro-stepped" element refers to an element that has stepped surfaces and a horizontal cross-sectional area that increases monotonically as a function of a vertical distance from a top surface of a substrate on which the element is present. If silicon oxide is employed as the dielectric material, the silicon oxide of the retro-stepped dielectric material portion 65 may, or may not, be doped with dopants such as B, P, and/or F. The top surface of the retro-stepped dielectric material portion 65 can be coplanar with the top surface of the first contact level dielectric layer 71.

The region over the peripheral devices 210 and the region over the stepped cavities can be filled simultaneously with the same dielectric material, or can be filled in different processing steps with the same dielectric material or with different dielectric materials. The cavity over the peripheral devices 210 can be filled with a dielectric material prior to, simultaneously with, or after, filling of the cavity over the stepped surface of the contact region 300 with a dielectric material. While the present disclosure is described employing an embodiment in which the cavity in the peripheral device region 200 and the stepped cavity in the contact region 300 are filled simultaneously, embodiments are expressly contemplated herein in which the cavity in the peripheral device region 200 and the stepped cavity in the contact region 300 are filled in different processing steps.

Referring to FIG. 5, dielectric support pillars 7P may be optionally formed through the retro-stepped dielectric material portion 65 and/or through the first contact level dielectric layer 71 and/or through the alternating stack (32, 42). In one embodiment, the dielectric support pillars 7P can be formed in the contact region 300, which is located adjacent to the device region 100. The dielectric support pillars 7P can be formed, for example, by forming an opening extending through the retro-stepped dielectric material portion 65 and/or through the alternating stack (32, 42) and at least to the top surface of the semiconductor substrate layer 10, and by filling the opening with a dielectric material that is resistant to the etch chemistry to be employed to remove the sacrificial material layers 42.

In one embodiment, the dielectric support pillars 7P can include silicon oxide and/or a dielectric metal oxide such as aluminum oxide. In one embodiment, the portion of the dielectric material that is deposited over the first contact level dielectric layer 71 concurrently with deposition of the dielectric support pillars 7P can be present over the first contact level dielectric layer 71 as a second contact level dielectric layer 73. Each of the dielectric support pillars 7P and the second contact level dielectric layer 73 is an optional structure. As such, the second contact level dielectric layer 73 may, or may not, be present over the insulating cap layer 70 and the retro-stepped dielectric material portion 65. The first contact level dielectric layer 71 and the second contact level dielectric layer 73 are herein collectively referred to as at least one contact level dielectric layer (71, 73). In one embodiment, the at least one contact level dielectric layer (71, 73) can include both the first and second contact level dielectric layers (71, 73), and optionally include any additional via level dielectric layer that can be subsequently formed. In another embodiment, the at least one contact level dielectric layer (71, 73) can include only the first contact level dielectric layer 71 or the second contact level dielectric layer 73, and optionally include any additional via level dielectric layer that can be subsequently formed. Alternatively, formation of the first and second contact level dielectric layers (71, 73) may be omitted, and at least one via level dielectric layer may be subsequently formed, i.e., after formation of a first source contact via structure.

The second contact level dielectric layer 73 and the dielectric support pillars 7P can be formed as a single continuous structure of integral construction, i.e., without any material interface therebetween. In another embodiment, the portion of the dielectric material that is deposited over the first contact level dielectric layer 71 concurrently with deposition of the dielectric support pillars 7P can be removed, for example, by chemical mechanical planarization or a recess etch. In this case, the second contact level dielectric layer 73 is not present, and the top surface of the first contact level dielectric layer 71 can be physically exposed.

Figure 6A:
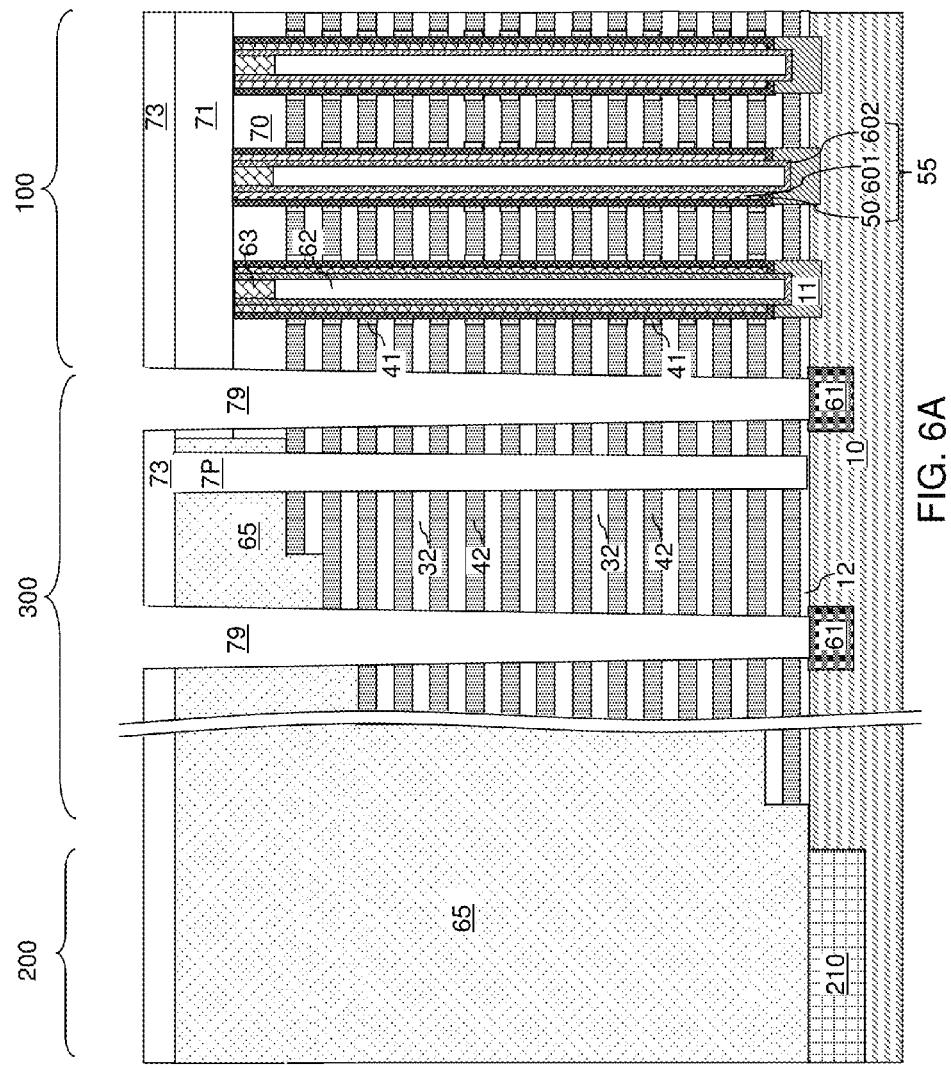
FIG. 6A is a vertical cross-sectional view of the exemplary structure after formation of backside trenches according to an embodiment of the present disclosure.
Figure 6B:
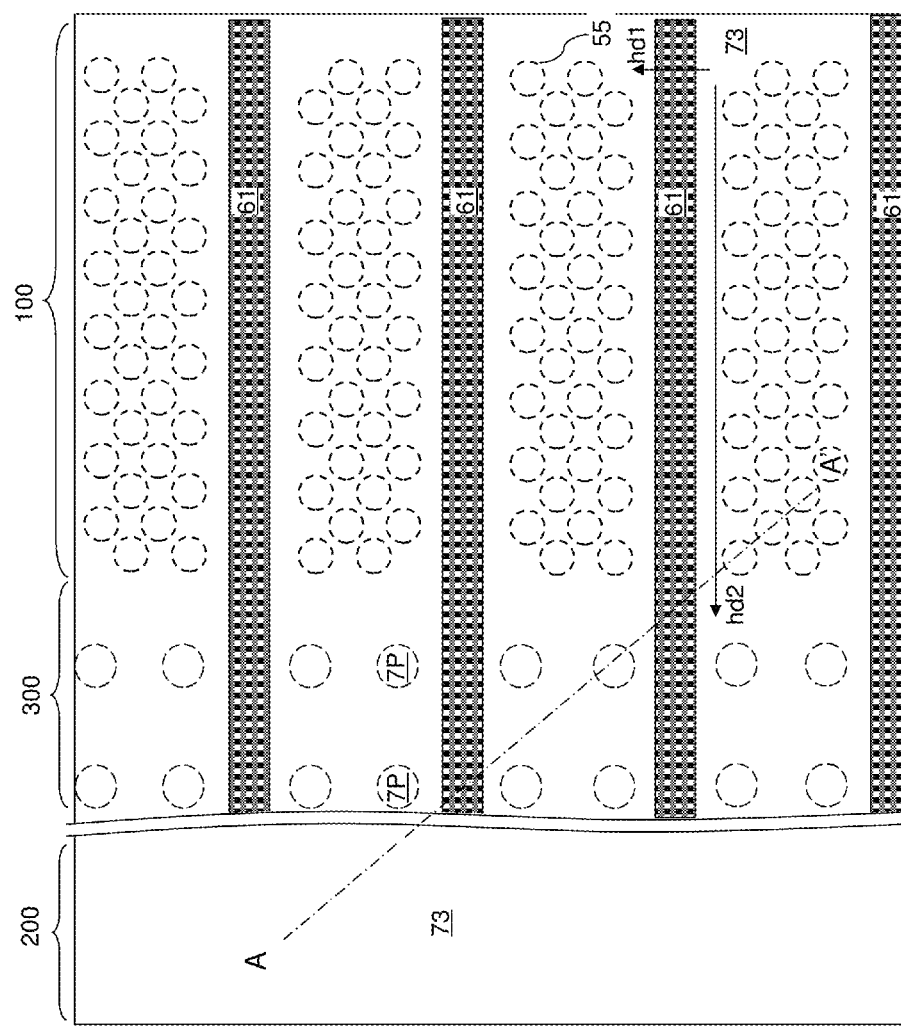
FIG. 6B is a see-through top-down view of the exemplary structure of FIG. 6A. The vertical plane A-A' is the plane of the vertical cross-sectional view of FIG. 6A.

Referring to FIGS. 6A and 6B, a photoresist layer (not shown) can be applied over the at least one contact level dielectric layer (71, 73), and can be lithographically patterned to form openings within areas between the memory blocks. In one embodiment, the memory blocks can be laterally spaced from one another along a first horizontal direction hd1 (e.g., bit line direction), and the dimension of each opening in the photoresist layer along the first horizontal direction hd1 can be less than the spacing between neighboring clusters (i.e., sets) of the memory stack structures 55 along the second horizontal direction hd2 (e.g., word line direction). Further, the dimension of each opening in the photoresist layer along a second horizontal direction hd2 (which is parallel to the lengthwise direction of each cluster of memory stack structures 55) can be greater than the extent of each cluster of the memory stack structures 55 along the first horizontal direction hd1.

Backside trenches 79 can be formed between each neighboring pair of clusters of the memory stack structures 55 by transferring the pattern of the openings in the photoresist layer through the at least one contact level dielectric layer (71, 73), the retro-stepped dielectric material portion 65, and the alternating stack (32, 42). A top surface of the semiconductor substrate layer 10 can be physically exposed at the bottom of each backside trench 79. In one embodiment, each backside trench 79 can extend along the second horizontal direction hd2 so that clusters of the memory stack structures 55 are laterally spaced along the first horizontal direction hd1. Each cluster of memory stack structures 55 in conjunction with the portions of the alternating stack (32, 42) that surround the cluster constitutes a memory block. Each memory block is laterally spaced from one another by the backside trenches 79.

In one embodiment, source regions 61 can be formed in, or on, portions of the semiconductor substrate layer 10 underlying the backside trenches 79 by implantation of dopants of a second conductivity type (which is the opposite of the first conductivity type) after formation of the backside trenches 79. For example, if the first conductivity type is p-type, the second conductivity type is n-type, and vice versa.

Figure 7:
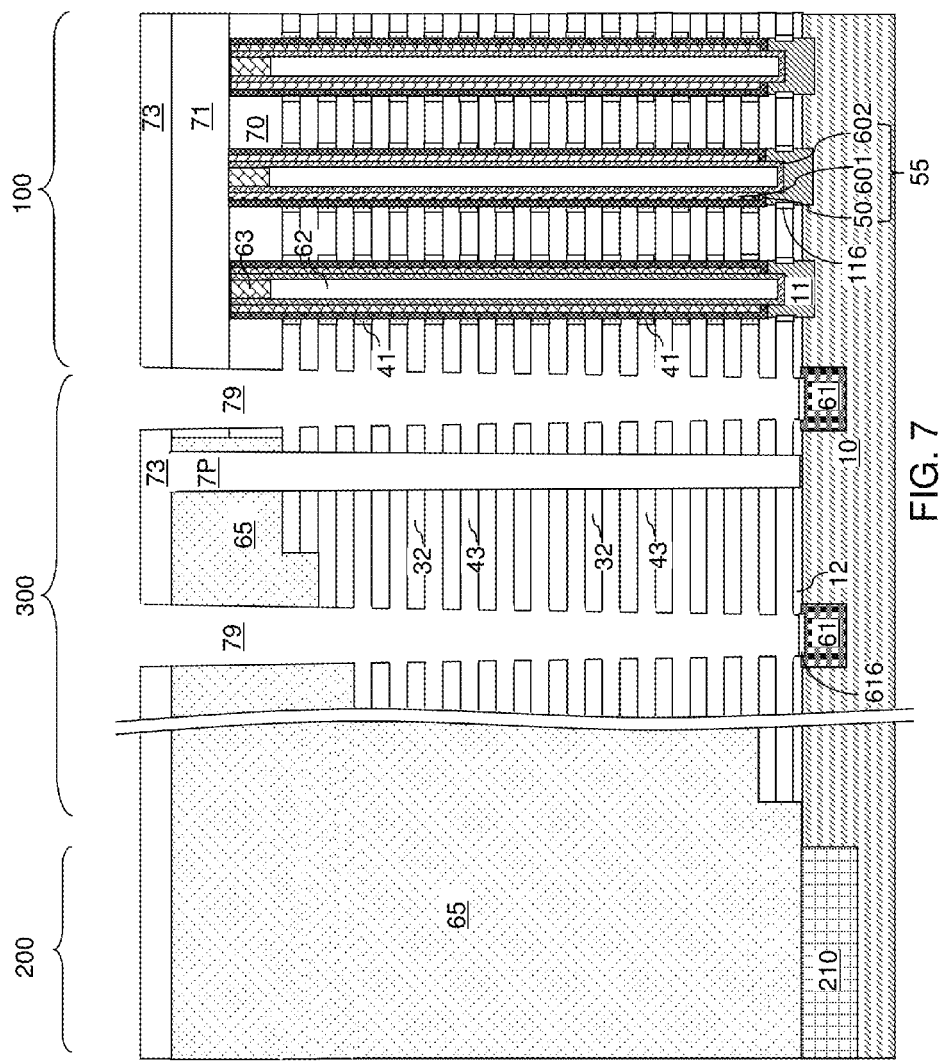
FIG. 7 is a vertical cross-sectional view of the exemplary structure after formation of backside recesses according to an embodiment of the present disclosure.

Referring to FIG. 7, an etchant that selectively etches the second material of the sacrificial material layers 42 with respect to the first material of the insulating layers 32 can be introduced into the backside trenches 79, for example, employing an etch process. Backside recesses 43 are formed in volumes from which the sacrificial material layers 42 are removed. The removal of the second material of the sacrificial material layers 42 can be selective to the first material of the insulating layers 32, the material of the dielectric support pillars 7P, the material of the retro-stepped dielectric material portion 65, the semiconductor material of the semiconductor substrate layer 10, and the material of the outermost layer of the first memory films 50. In one embodiment, the sacrificial material layers 42 can include silicon nitride, and the materials of the insulating layers 32, the dielectric support pillars 7P, and the retro-stepped dielectric material portion 65 can be selected from silicon oxide and dielectric metal oxides.

The etch process that removes the second material selective to the first material and the outermost layer of the first memory films 50 can be a wet etch process employing a wet etch solution, or can be a gas phase (dry) etch process in which the etchant is introduced in a vapor phase into the backside trenches 79. For example, if the sacrificial material layers 42 include silicon nitride, the etch process can be a wet etch process in which the exemplary structure is immersed within a wet etch tank including phosphoric acid, which etches silicon nitride selective to silicon oxide, silicon, and various other materials employed in the art. The dielectric support pillars 7P, the retro-stepped dielectric material portion 65, and the memory stack structures 55 provide structural support while the backside recesses 43 are present within volumes previously occupied by the sacrificial material layers 42.

Each backside recess 43 can be a laterally extending cavity having a lateral dimension that is greater than the vertical extent of the cavity. In other words, the lateral dimension of each backside recess 43 can be greater than the height of the backside recess 43. A plurality of backside recesses 43 can be formed in the volumes from which the second material of the sacrificial material layers 42 is removed. The first memory openings in which the memory stack structures 55 are formed are herein referred to as front side openings or holes in contrast with the backside recesses 43. In one embodiment, the device region 100 comprises an array of monolithic three-dimensional NAND strings having a plurality of device levels disposed above the substrate (e.g., above the semiconductor substrate layer 10). In this case, each backside recess 43 can define a space for receiving a respective word line of the array of monolithic three-dimensional NAND strings.

Each of the plurality of backside recesses 43 can extend substantially parallel to the top surface of the semiconductor substrate layer 10. A backside recess 43 can be vertically bounded by a top surface of an underlying insulating layer 32 and a bottom surface of an overlying insulating layer 32. In one embodiment, each backside recess 43 can have a uniform height throughout.

Subsequently, physically exposed surface portions of epitaxial channel portions 11 and the source regions 61 can be converted into dielectric material portions by thermal conversion and/or plasma conversion of the semiconductor materials into dielectric materials. For example, thermal conversion and/or plasma conversion can be employed to convert a surface portion of each epitaxial channel portion 11 into a dielectric spacer 116, and to convert a surface portion of each source region 61 into a sacrificial dielectric portion 616. In one embodiment, each dielectric spacer 116 can be topologically homeomorphic to a torus, i.e., generally ring-shaped. As used herein, an element is topologically homeomorphic to a torus if the shape of the element can be continuously stretched without destroying a hole or forming a new hole into the shape of a torus. The dielectric spacers 116 include a dielectric material that includes the same semiconductor element as the epitaxial channel portions 11 and additionally includes at least one non-metallic element such as oxygen and/or nitrogen such that the material of the dielectric spacers 116 is a dielectric material. In one embodiment, the dielectric spacers 116 can include a dielectric oxide, a dielectric nitride, or a dielectric oxynitride of the semiconductor material of the epitaxial channel portions 11. Likewise, each sacrificial dielectric portion 616 includes a dielectric material that includes the same semiconductor element as the source regions 61 and additionally includes at least one non-metallic element such as oxygen and/or nitrogen such that the material of the sacrificial dielectric portions 616 is a dielectric material. In one embodiment, the sacrificial dielectric portions 616 can include a dielectric oxide, a dielectric nitride, or a dielectric oxynitride of the semiconductor material of the source region 61.

A backside blocking dielectric layer (not shown) can be optionally formed. The backside blocking dielectric layer, if present, comprises a dielectric material that functions as a control gate dielectric for the control gates to be subsequently formed in the backside recesses 43. In case at least one blocking dielectric is present within each memory stack structure 55, the backside blocking dielectric layer is optional. In case a blocking dielectric is not present in the memory stack structures 55, the backside blocking dielectric layer is present.

Figure 8:
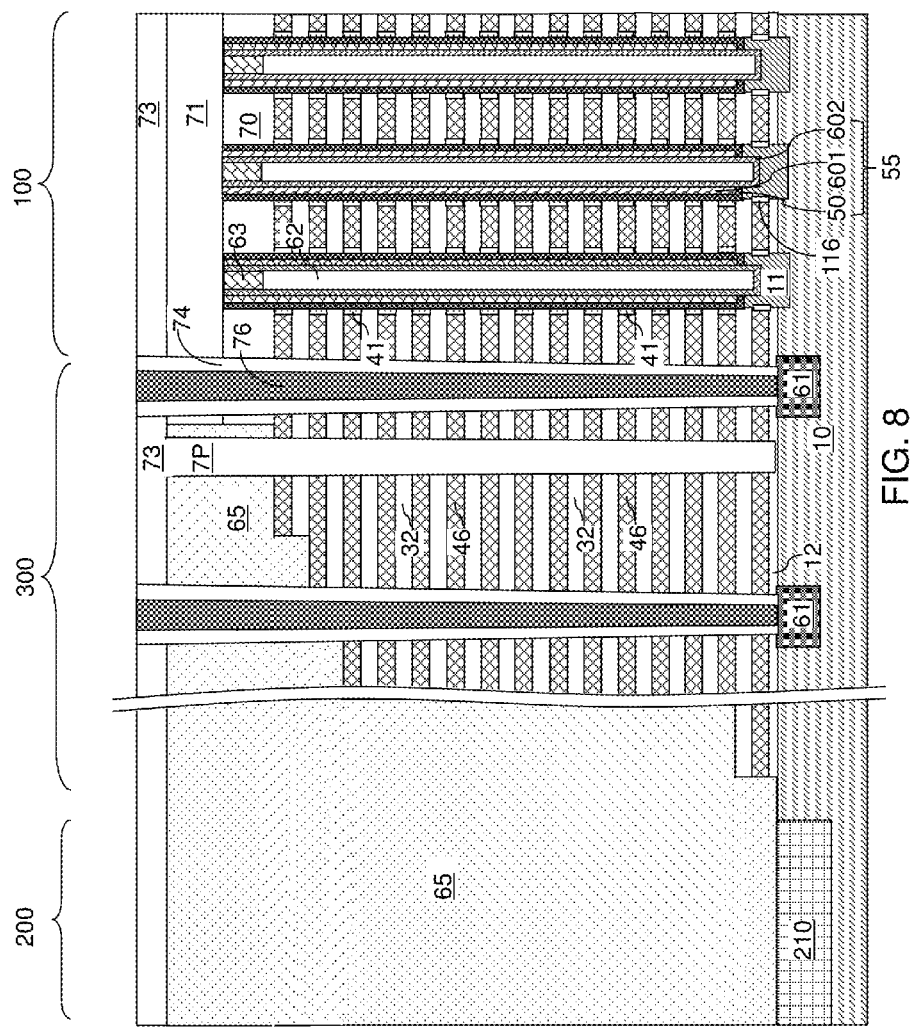
FIG. 8 is a vertical cross-sectional view of the exemplary structure after formation of electrically conductive layers according to an embodiment of the present disclosure.

Referring to FIG. 8, at least one metallic material can be deposited in the plurality of backside recesses 43, on the sidewalls of the at least one the backside contact trench 79, and over the top surface of the second contact level dielectric layer 73. As used herein, a metallic material refers to an electrically conductive material that includes at least one metallic element The metallic material can be deposited by a conformal deposition method, which can be, for example, chemical vapor deposition (CVD), atomic layer deposition (ALD), electroless plating, electroplating, or a combination thereof. The metallic material can be an elemental metal, an intermetallic alloy of at least two elemental metals, a conductive nitride of at least one elemental metal, a conductive metal oxide, a conductive doped semiconductor material, a conductive metal-semiconductor alloy such as a metal silicide, alloys thereof, and combinations or stacks thereof. Non-limiting exemplary metallic materials that can be deposited in the plurality of backside recesses 43 include tungsten, tungsten nitride, titanium, titanium nitride, tantalum, tantalum nitride, cobalt, and ruthenium. In one embodiment, the metallic material can comprise a metal such as tungsten and/or metal nitride. In one embodiment, the metallic material for filling the plurality of backside recesses 43 can be a combination of titanium nitride layer and a tungsten fill material.

In one embodiment, the metallic material can be deposited by chemical vapor deposition or atomic layer deposition. In one embodiment, the metallic material can be employing at least one fluorine-containing precursor gas as a precursor gas during the deposition process. In one embodiment, the molecule of the at least one fluorine-containing precursor gas cam comprise a compound of at least one tungsten atom and at least one fluorine atom. For example, if the metallic material includes tungsten, $WF_6$ and $H_2$ can be employed during the deposition process. Alternatively, fluorine-free deposition chemistry may be employed.

A plurality of electrically conductive layers 46 can be formed in the plurality of backside recesses 43, and a continuous metallic material layer (not shown) can be formed on the sidewalls of each backside contact trench 79 and over the at least one contact level dielectric layer (71,73). Thus, each sacrificial material layer 42 can be replaced with an electrically conductive layer 46. A backside cavity is present in the portion of each backside contact trench 79 that is not filled with the backside blocking dielectric layer and the continuous metallic material layer.

The deposited metallic material of the continuous metallic material layer is etched back from the sidewalls of each backside contact trench 79 and from above the second contact level dielectric layer 73, for example, by an isotropic etch. Each remaining portion of the deposited metallic material in the backside recesses 43 constitutes an electrically conductive layer 46. Each electrically conductive layer 46 can be a conductive line structure. Thus, the sacrificial material layers 42 are replaced with the electrically conductive layers 46.

Each electrically conductive layer 46 can function as a combination of a plurality of control gate electrodes located at a same level and a word line electrically interconnecting, i.e., electrically shorting, the plurality of control gate electrodes located at the same level. The plurality of control gate electrodes within each electrically conductive layer 46 are the control gate electrodes for the vertical memory devices including the memory stack structures 55. In other words, each electrically conductive layer 46 can be a word line that functions as a common control gate electrode for the plurality of vertical memory devices. Optionally, the sacrificial dielectric portions 616 can be removed from above the source regions 61 during the last processing step of the anisotropic etch. Each backside trench 79 extends through the alternating stack (32, 46) of the insulating layers 32 and the electrically conductive layers 46 and to the top surface of the substrate 10.

FIGS. 9A-9D illustrate magnified views of various embodiments of the exemplary structure around a memory stack structures 55 after formation of electrically conductive layers 46. FIG. 9A illustrates a first exemplary embodiment in which silicon oxide-containing portions 41O are formed and a backside blocking dielectric layer is not employed. In this case, surface portions of the sacrificial material layers 42 that are proximal to the crystalline aluminum oxide portions 41C are converted into silicon oxide-containing portions 41O by diffusing oxygen through the crystalline aluminum oxide portions 41C into the surface portions of the sacrificial material layers 42 at the processing steps of FIG. 2K. The electrically conductive layers 46 are formed directly on surfaces of the silicon oxide-containing portions 41O.

FIG. 9B illustrates a second exemplary embodiment in which in which silicon oxide-containing portions 41O are formed and a backside blocking dielectric layer 501 is formed. In this case, surface portions of the sacrificial material layers 42 that are proximal to the crystalline aluminum oxide portions 41C are converted into silicon oxide-containing portions 41O by diffusing oxygen through the crystalline aluminum oxide portions 41C into the surface portions of the sacrificial material layers 42 at the processing steps of FIG. 2K. The backside blocking dielectric layer 501 is deposited prior to formation of the electrically conductive layers 46. The electrically conductive layers 46 are formed directly on surfaces of the backside blocking dielectric layer 501.

FIG. 9C illustrates a third exemplary embodiment in which silicon oxide-containing portions 41O are not formed, and a backside blocking dielectric layer is not employed. In this case, the processing steps of FIG. 2K are omitted. The electrically conductive layers 46 are in contact with outer sidewalls of the crystalline aluminum oxide portions 41C.

FIG. 9D illustrates a fourth exemplary embodiment in which in which silicon oxide-containing portions 41O are not formed and a backside blocking dielectric layer 501 is formed. In this case, the processing steps of FIG. 2K are omitted. The backside blocking dielectric layer 501 is deposited prior to formation of the electrically conductive layers 46. The electrically conductive layers 46 are formed directly on surfaces of the backside blocking dielectric layer 501.

Figure 10A:
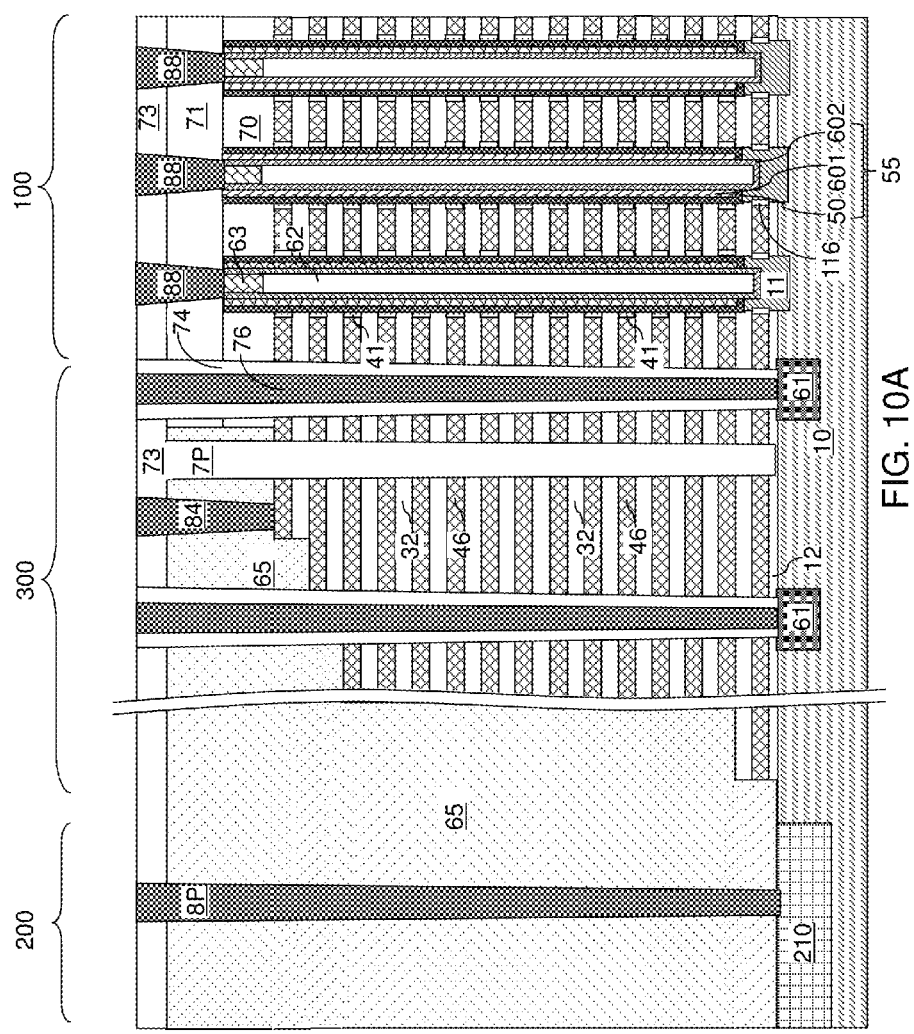
FIG. 10A is a vertical cross-sectional view of the exemplary structure after formation of additional contact via structures according to an embodiment of the present disclosure.
Figure 10B:
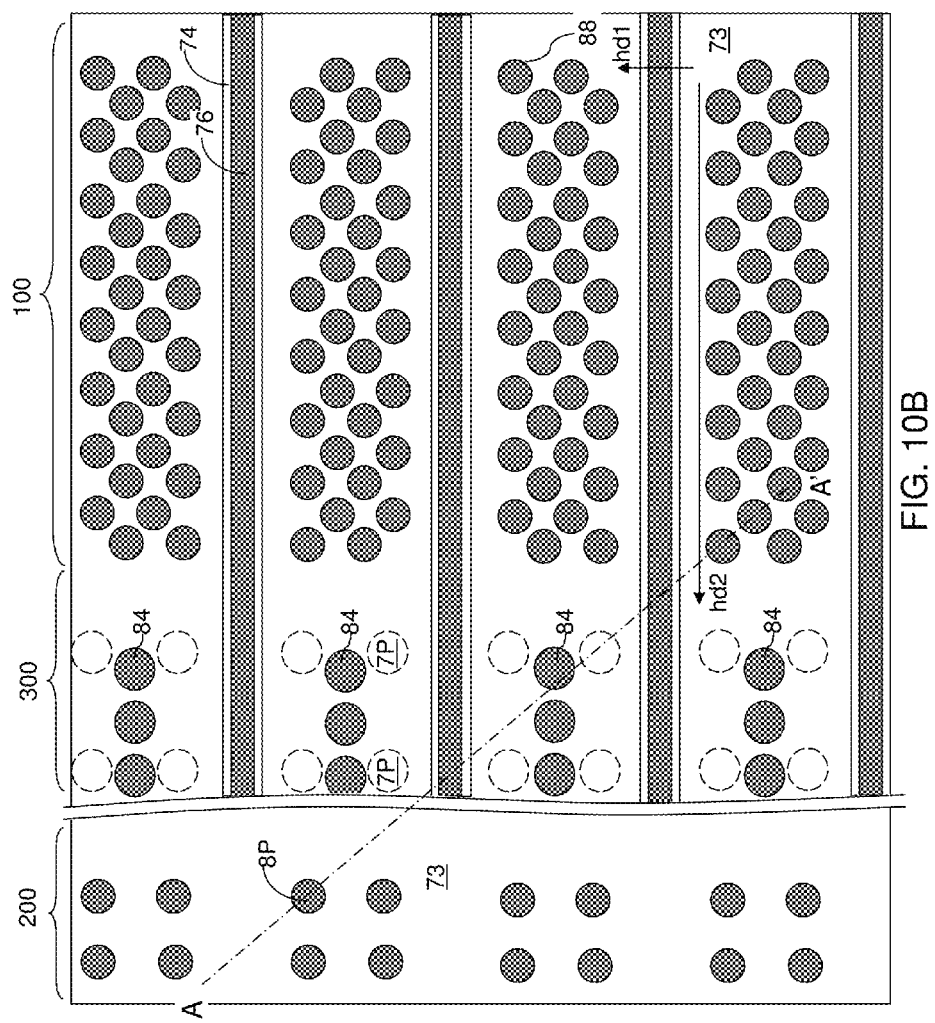
FIG. 10B is a see-through top-down view of the exemplary structure of FIG. 10A. The vertical plane A-A' is the plane of the vertical cross-sectional view of FIG. 10A.

Referring to FIGS. 10A and 10B, an insulating material layer can be formed in each backside contact trench 79 and over the second contact level dielectric layer 73 by a conformal deposition process. Exemplary conformal deposition processes include, but are not limited to, chemical vapor deposition and atomic layer deposition. The insulating material layer includes an insulating material such as silicon oxide, silicon nitride, a dielectric metal oxide, an organosilicate glass, or a combination thereof. The thickness of the insulating material layer can be in a range from 1.5 nm to 60 nm, although lesser and greater thicknesses can also be employed.

Subsequently, an anisotropic etch is performed to remove horizontal portions of the insulating material layer and to optionally remove the horizontal portion of the backside blocking dielectric layer from above the second contact level dielectric layer 73. Each remaining portion of the insulating material layer inside a backside contact trench 79 constitutes a vertically elongated annular structure with a vertical cavity therethrough, which is herein referred to as an insulating spacer 74. In one embodiment, an annular bottom surface of the insulating spacer 74 contacts a top surface of the source region 61.

Each insulating spacer 74 can be formed over the sidewalls of the backside contact trench 79, and can be formed directly on the sidewalls of the electrically conductive layers 46, i.e., directly on the sidewalls of the metallic material portions 46. The thickness of each insulating spacer 74, as measured at a bottom portion thereof, can be in a range from 1.5 nm to 60 nm, although lesser and greater thicknesses can also be employed. In one embodiment, the thickness of the insulating spacer 74 can be in a range from 3 nm to 10 nm. Each insulating spacer 74 laterally surrounds a cavity, which is herein referred to as a backside cavity. A top surface of a source region 61 (which is a doped semiconductor material portion) can be physically exposed at the bottom of each backside cavity that is provided within an insulating spacer 74.

At least one metallic material can be deposited into each backside cavity. The at least one metallic material can include, for example, a metallic diffusion barrier layer including a conductive metallic nitride and/or a conductive metallic carbide. Further, the at least one metallic material can include a metallic fill material such as an elemental metal (e.g., W, Co, or Al) or an intermetallic alloy of at least two elemental metals. Excess portions of the at least one metallic material can be removed from above the horizontal plane including the top surface of the contact level dielectric layers (71, 73). Each remaining portion of the at least one metallic material in a backside trench constitutes a backside contact via structure 76.

Referring to FIGS. 10A and 10B, a photoresist layer (not shown) can be applied over the topmost layer of the exemplary structure (which can be, for example, the second contact level dielectric layer 73), and is lithographically patterned to form various openings in the device region 100, the peripheral device region 200, and the contact region 300. The locations and the shapes of the various openings are selected to correspond to electrical nodes of the various devices to be electrically contacted by contact via structures. In one embodiment, a single photoresist layer may be employed to pattern all openings that correspond to the contact via cavities to be formed, and all contact via cavities can be simultaneously formed by at least one anisotropic etch process that employs the patterned photoresist layer as an etch mask. In another embodiment, a plurality of photoresist layers may be employed in combination with a plurality of anisotropic etch processes to form different sets of contact via cavities with different patterns of openings in the photoresist layers. The photoresist layer(s) can be removed after a respective anisotropic etch process that transfers the pattern of the openings in the respective photoresist layer through the underlying dielectric material layers and to a top surface of a respective electrically conductive structure.

In an illustrative example, drain contact via cavities can be formed over each memory stack structure 55 in the device region 100 such that a top surface of a drain region 63 is physically exposed at the bottom of each drain contact via cavity. Word line contact via cavities can be formed to the stepped surfaces of the alternating stack (32, 46) such that a top surface of an electrically conductive layer 46 is physically exposed at the bottom of each word line contact via cavity in the contact region 300. A device contact via cavity can be formed to each electrical node of the peripheral devices 210 to be contacted by a contact via structure in the peripheral device region.

The various via cavities can be filled with at least one conductive material, which can be a combination of an electrically conductive metallic liner material (such as TiN, TaN, or WN) and a metallic fill material (such as W, Cu, or Al). Excess portions of the at least one conductive material can be removed from above the at least one contact level dielectric layer (71, 73) by a planarization process, which can include, for example, chemical mechanical planarization (CMP) and/or a recess etch. Drain contact via structures 88 can be formed on the respective drain regions 63. Word line contact via structures 84 can be formed on the respective electrically conductive layers 46. Peripheral device contact via structures 8P can be formed on the respective nodes of the peripheral devices 210. Additional metal interconnect structures (not shown) and interlayer dielectric material layers (not) shown can be formed over the exemplary structure to provide electrical wiring among the various contact via structures.

The various embodiments of the present disclosure can include a three-dimensional memory device. The three-dimensional memory device can be a monolithic device, and includes an alternating stack of insulating layers 32 and electrically conductive layers 46 located over a substrate 10, and a memory stack structure 55 extending through the alternating stack (32, 46). The memory stack structure includes, from inside to outside, a semiconductor channel (601, 602), a tunneling dielectric 506, and a vertical stack of charge storage regions as embodied in discrete portions of a memory material layer 504 at the levels of the electrically conductive layers 46. The three-dimensional memory device can include a plurality of crystalline aluminum oxide portions 41C located at levels of the electrically conductive layers 46 and laterally surrounding the memory stack structure 55. Optionally, the three-dimensional memory device can include a plurality of silicon oxide-containing portions 41O contacting an outer sidewall of a respective crystalline aluminum oxide portion 41C. Each of the silicon-oxide containing portions 41O includes a silicon oxynitride portion having a radial nitrogen concentration gradient around the memory opening.

The memory stack structure 55 can be formed in the memory opening and inside remaining portions of the crystalline aluminum oxide portions 41C that remain after removal of the amorphous aluminum oxide portions 41U at the processing steps of FIG. 2I. In one embodiment, each insulating layer 32 can contact a horizontal surface of a crystalline aluminum oxide portion 41C, a horizontal surface of a silicon oxide-containing portion 41O, and a horizontal surface of an electrically conductive layer 46. The horizontal surface of the crystalline aluminum oxide portion 41C, the horizontal surface of the silicon oxide-containing portion 41O, and the horizontal surface of the electrically conductive layer 46 may be located within a same horizontal plane. Alternatively, the horizontal surface of the crystalline aluminum oxide portion 41C, the horizontal surface of the silicon oxide-containing portion 41O, and a horizontal surface of a backside blocking dielectric layer 501 may be located within a same horizontal plane.

In one embodiment, the device located on the semiconductor substrate can include a vertical NAND device located in the device region 100, and at least one of the electrically conductive layers 46 in the stack (32, 46) can comprise, or can be electrically connected to, a word line of the NAND device. The device region 100 can include a plurality of semiconductor channels 60 comprising at least one channel layer 601, 602. At least one end portion of each of the plurality of semiconductor channels (601, 602) extends substantially perpendicular to a top surface of the semiconductor substrate. The device region 100 further includes a plurality of charge storage regions located within each memory layer 50. Each charge storage region is located adjacent to a respective one of the plurality of semiconductor channels (601, 602). The device region 100 further includes a plurality of control gate electrodes having a strip shape extending substantially parallel to the top surface of the substrate (e.g., substrate semiconductor layer 10). The plurality of control gate electrodes comprise at least a first control gate electrode located in the first device level and a second control gate electrode located in the second device level. The plurality of electrically conductive layers 46 in the stack (32, 46) can be in electrical contact with, or can comprise, the plurality of control gate electrodes, and extends from the device region 100 to a contact region 300 including a plurality of electrically conductive contact via structures.

In case the exemplary structure includes a three-dimensional NAND device, a stack (32, 46) of an alternating plurality of word lines 46 and insulating layers 32 can be located over a semiconductor substrate. Each of the word lines 46 and insulating layers 32 is located at different levels that are vertically spaced from a top surface of the semiconductor substrate by different distances. An array of memory stack structures 55 is embedded within the stack (32, 46). Each memory stack structure 55 comprises a semiconductor channel (601, 602) and at least one charge storage region located adjacent to the semiconductor channel (601, 602). At least one end portion of the semiconductor channel (601, 602) extends substantially perpendicular to the top surface of the semiconductor substrate through the stack (32, 46).

FIGS. 11A and 11B illustrate steps to form a backside aluminum oxide blocking dielectric according to an alternative embodiment method of the present disclosure. In this method, rather than forming the aluminum oxide layer 410L in the memory opening 49, the aluminum oxide layer 510L is formed in the backside trench 79 and backside recesses 43.

Specifically, in this embodiment, the aluminum oxide layer 410L and blocking dielectric 503 are not formed in the memory opening 49. Instead, after the structure shown in FIG. 2B is formed, the continuous memory material layer 504L is formed in the memory opening 49 such that layer 504L contacts the sidewalls of the opening 49. Layer 504L may be a silicon nitride layer which forms the outer layer of the memory film 50. Then, the steps of FIGS. 2L-2Q and 3-7 are performed to form the tunneling dielectric 506, the semiconductor channel 60, the backside trench 79 and the backside recesses 43.

After formation of the backside recesses 43 in FIG. 7, the aluminum oxide layer 510L, such as an amorphous aluminum oxide layer, is formed in the backside trench 79 and in the backside recesses 43, as shown in FIG. 11A. First aluminum oxide portions of the aluminum oxide layer are located on sidewall surfaces of the memory material layer 504 (e.g., silicon nitride layer) exposed at the inner portions of the recesses 43, and second aluminum oxide portions of the aluminum oxide layer are located on outer, top and bottom sidewalls of the insulating layers 32 (e.g., silicon oxide layers).

As shown in FIG. 11B, the aluminum oxide layer 510L is optionally annealed to selectively crystallize the layer. The first portions of the amorphous aluminum oxide layer 510L on the sidewall surfaces of the memory material layer 504 are crystallized into crystalline aluminum oxide portions 51C, while second portions of the amorphous aluminum oxide layer 410L on the sidewalls of the insulating layers 32 remain as amorphous aluminum oxide portions 51U.

The second (e.g., amorphous) aluminum oxide portions 51U are then selectively removed at a greater etch rate than the first (e.g., crystalline) aluminum oxide portions employing a selective etch process by providing the etching medium described above into the backside trench 79 and the backside recesses 43. All or a predominant portion of each first aluminum oxide portion 51C remains after removal of the second aluminum oxide portions 51U.

The process steps of FIGS. 8, 9C and 10A-10B are then carried out to form the electrically conductive layers 46 and the remaining layers to complete the memory device having a structure similar to that shown in FIGS. 9C and 10A-10B.

The aluminum oxide portions 51C function as the blocking dielectric in this structure and contact the memory material layer 504. If desired, additional blocking dielectric layer(s), such as layer 501 shown in FIG. 9D, may be formed in the backside recesses 43 in contact with the portions 51C prior to forming the electrically conductive layers 46.

Although the foregoing refers to particular preferred embodiments, it will be understood that the disclosure is not so limited. It will occur to those of ordinary skill in the art that various modifications may be made to the disclosed embodiments and that such modifications are intended to be within the scope of the disclosure. Where an embodiment employing a particular structure and/or configuration is illustrated in the present disclosure, it is understood that the present disclosure may be practiced with any other compatible structures and/or configurations that are functionally equivalent provided that such substitutions are not explicitly forbidden or otherwise known to be impossible to one of ordinary skill in the art. All of the publications, patent applications and patents cited herein are incorporated herein by reference in their entirety.

What is claimed is:

1. A method of forming a device, comprising:
   forming an alternating stack of insulating layers and sacrificial material layers over a substrate;
   forming a memory opening extending through the alternating stack;
   forming an aluminum oxide layer directly on sidewall surfaces of the sacrificial material layers and directly on sidewall surfaces of the insulating layers after formation of the memory opening within a volume of the memory opening, such that first aluminum oxide portions of the aluminum oxide layer are located on sidewall surfaces of the sacrificial material layers, and second aluminum oxide portions of the aluminum oxide layer are located on sidewalls of the insulating layers; and
   removing the second aluminum oxide portions at a greater etch rate than the first aluminum oxide portions employing a selective etch process, wherein all or a predominant portion of each first aluminum oxide portion remains after removal of the second aluminum oxide portions.

2. The method of claim 1, further comprising performing a selective crystallization anneal process on the aluminum oxide layer which comprises an amorphous aluminum oxide layer,
   wherein:
   the first aluminum oxide portions of the amorphous aluminum oxide layer are crystallized into crystalline aluminum oxide portions while the second aluminum oxide portions of the amorphous aluminum oxide layer on the sidewalls of the insulating layers remain as amorphous aluminum oxide portions; and
   removing the second aluminum oxide portions at a greater etch rate than the first aluminum oxide portions comprises removing the amorphous aluminum oxide portions at a greater etch rate than the crystalline aluminum oxide portions employing the selective etch process, wherein all or a predominant portion of each crystalline aluminum oxide portion remains after removal of the amorphous aluminum oxide portions.

3. The method of claim 2, wherein:
   the insulating layers comprise silicon oxide;
   the sacrificial material layers comprise silicon or silicon nitride;

the amorphous aluminum oxide layer has a thickness of 3 nm or less;
the selective etch process comprises a selective wet etch process;
the amorphous aluminum oxide layer comprises an amorphous horizontal aluminum oxide portion located at a bottom of the memory opening; and
the amorphous horizontal portion is removed simultaneously with removal of the amorphous aluminum oxide portions.

4. The method of claim 3, further comprising:
providing a silicon surface at a bottom the memory opening; and
forming a silicon oxide portion by oxidizing the silicon surface;
wherein:
the amorphous horizontal aluminum oxide portion is formed on a top surface of the silicon oxide portion; and
the amorphous horizontal aluminum oxide portion remains amorphous through the selective crystallization anneal process.

5. The method of claim 3, further comprising converting surface portions of the sacrificial material layers that are proximal to the crystalline aluminum oxide portions into silicon oxide-containing portions by diffusing oxygen through the crystalline aluminum oxide portions into the surface portions of the sacrificial material layers, wherein each of the silicon oxide-containing portions includes a silicon oxynitride portion having a radial nitrogen concentration gradient around the memory opening.

6. The method of claim 3, wherein the selective crystallization anneal process is performed at an elevated temperature in a range from 850 degrees Celsius to 1,100 degrees Celsius for 15 to 120 seconds.

7. The method of claim 3, wherein:
the sacrificial material layers comprise silicon nitride layers;
the amorphous aluminum oxide layer is deposited at the same time on surfaces of the silicon nitride layers and on surfaces of the silicon oxide insulating layers;
the first portions of the amorphous aluminum oxide layer located on the surfaces of the silicon nitride layers have a greater thickness than the second portions of the amorphous aluminum oxide layer located on surfaces of the silicon oxide insulating layers; and
the thicker first portions of the amorphous aluminum oxide layer are crystallized during the selective crystallization anneal process while the second portions of the amorphous aluminum oxide layer remain amorphous.

8. The method of claim 3, wherein:
the sacrificial material layers comprise silicon layers;
the amorphous aluminum oxide layer is deposited at the same time on surfaces of the silicon layers and on surfaces of the silicon oxide insulating layers;
the first portions of the amorphous aluminum oxide layer have a higher initial crystalline volume fraction than the second portions of the amorphous aluminum oxide layer; and
the first portions of the amorphous aluminum oxide layer are crystallized during the selective crystallization anneal process due to the higher initial crystalline volume fraction while the second portions of the amorphous aluminum oxide layer remain amorphous.

9. The method of claim 2, further comprising:
forming backside recesses by removing the sacrificial material layers selective to the insulating layers after removal of the amorphous aluminum oxide portions; and
filling at least portions of the backside recesses with electrically conductive layers.

10. The method of claim 9, further comprising converting surface portions of the sacrificial material layers that are proximal to the crystalline aluminum oxide portions into silicon oxide-containing portions by diffusing oxygen through the crystalline aluminum oxide portions into the surface portions of the sacrificial material layers, wherein the electrically conductive layers are formed directly on surfaces of the silicon oxide-containing portions.

11. The method of claim 9, further comprising:
converting surface portions of the sacrificial material layers that are proximal to the crystalline aluminum oxide portions into silicon oxide-containing portions by diffusing oxygen through the crystalline aluminum oxide portions into the surface portions of the sacrificial material layers; and
forming a backside blocking dielectric layer directly on surfaces of the insulating layers and the crystalline aluminum oxide portion within the backside recesses, wherein the electrically conductive layers are formed directly on surfaces of the backside blocking dielectric layer.

12. The method of claim 9, wherein the electrically conductive layers are formed directly on surfaces of the crystalline aluminum oxide portions within the backside recesses.

13. The method of claim 9, further comprising forming a backside blocking dielectric layer directly on surfaces of the insulating layers and the crystalline aluminum oxide portions within the backside recesses, wherein the electrically conductive layers are formed directly on surfaces of the backside blocking dielectric layer.

14. The method of claim 2, further comprising laterally recessing the sacrificial material layers relative to sidewall surfaces of the insulating layers prior to depositing the amorphous aluminum oxide layer, wherein recessed sidewalls of the sacrificial material layers are the sidewall surfaces of the sacrificial material layers on which the amorphous aluminum oxide layer is deposited.

15. The method of claim 2, further comprising forming a memory stack structure in the memory opening and inside remaining portions of the crystalline aluminum oxide portions that remain after removal of the amorphous aluminum oxide portions, wherein the memory stack structure comprises, from inside to outside:
a semiconductor channel;
a tunneling dielectric laterally surrounding the semiconductor channel; and
charge storage regions laterally surrounding the tunneling dielectric layer.

16. The method of claim 1, wherein:
the device comprises a vertical NAND device formed in a device region;
the method comprises replacing the sacrificial material layers with electrically conductive layers;
the electrically conductive layers comprise, or are electrically connected to a respective word line of the NAND device;
the device region comprises:
a plurality of semiconductor channels, wherein at least one end portion of each of the plurality of semiconductor channels extends substantially perpendicular to a top surface of the substrate;

a plurality of charge storage regions, each charge storage region located adjacent to a respective one of the plurality of semiconductor channels; and a plurality of control gate electrodes having a strip shape extending substantially parallel to the top surface of the substrate;

the plurality of control gate electrodes comprise at least a first control gate electrode located in a first device level and a second control gate electrode located in a second device level;

the electrically conductive layers in the stack are in electrical contact with the plurality of control gate electrode and extend from the device region to a contact region including the plurality of electrically conductive via connections; and the substrate comprises a silicon substrate containing a driver circuit for the NAND device.

17. The method of claim 1, further comprising replacing the sacrificial material layers with electrically conductive layers.

18. The method of claim 1, wherein each layer within the alternating stack is formed by sequential deposition of each layer from bottom to top.

19. The method of claim 1, wherein forming the alternating stack of insulating layers and sacrificial material layers over the substrate comprises depositing a first insulating layer over the substrate, followed by depositing a first sacrificial material layer on the first insulating layer, followed by depositing a second insulating layer on the first sacrificial material layer, and followed by depositing a second sacrificial material layer on the second insulating layer.

* * * * *